United States Patent
Iida et al.

(10) Patent No.: US 7,692,993 B2
(45) Date of Patent: Apr. 6, 2010

(54) SEMICONDUCTOR MEMORY DEVICE

(75) Inventors: Masahisa Iida, Osaka (JP); Kiyoto Ohta, Osaka (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 12/100,271

(22) Filed: Apr. 9, 2008

(65) Prior Publication Data
US 2008/0253212 A1 Oct. 16, 2008

(30) Foreign Application Priority Data
Apr. 10, 2007 (JP) ............................. 2007-102910

(51) Int. Cl.
*G11C 7/00* (2006.01)
(52) U.S. Cl. ...................................... 365/222; 365/201
(58) Field of Classification Search ................ 365/222, 365/201, 230.03, 236
See application file for complete search history.

(56) References Cited

U.S. PATENT DOCUMENTS

| | | | |
|---|---|---|---|
| 4,914,630 A | 4/1990 | Fujishima et al. | |
| 5,251,176 A | 10/1993 | Komatsu | |
| 5,566,119 A * | 10/1996 | Matano | 365/222 |
| 6,563,757 B2 | 5/2003 | Agata | |
| 6,967,885 B2 | 11/2005 | Barth, Jr. et al. | |
| 7,215,589 B2 * | 5/2007 | Dono et al. | 365/222 |
| 7,388,799 B2 * | 6/2008 | An | 365/222 |
| 2007/0211549 A1 | 9/2007 | Kobayashi | |

FOREIGN PATENT DOCUMENTS

JP 2005-203092 7/2005

* cited by examiner

*Primary Examiner*—Anh Phung
(74) *Attorney, Agent, or Firm*—McDermott Will & Emery LLP

(57) ABSTRACT

A semiconductor memory device includes a plurality of memory blocks, a plurality of refresh block counters, a refresh word line counter, and an arbitration circuit. The plurality of refresh block counters generate block addresses of at least two memory blocks to select at least two memory blocks to be refreshed from the plurality of memory blocks. The refresh word line counter generates a common word line address that is common to the at least two memory blocks. The arbitration circuit generates at least one first word line address based on the at least two block addresses and the common word line address and arbitrate so that each word line indicated by the at least one first word line address is refreshed during a period in which a word line indicated by an externally applied second word line address is accessed.

29 Claims, 26 Drawing Sheets

SEMICONDUCTOR MEMORY DEVICE

CROSS REFERENCE TO RELATED APPLICATION

This application claims priority under 35 U.S.C. §119 on Patent Application No. 2007-102910 filed in Japan on Apr. 10, 2007, the entire contents of which are hereby incorporated by reference.

BACKGROUND OF THE INVENTION

1. Field of the Invention

The invention generally relates to a semiconductor memory device. More particularly, the invention relates to a refresh operation of a DRAM (Dynamic Random Access Memory).

2. Background Art

In order to implement SOC (System On Chip) at low cost, higher integration has been required especially for an embedded DRAM in recent years. It is a memory array portion having a plurality of memory cells which occupies most of the memory area. In order to implement higher integration, the memory cell area has been reduced by miniaturization technology of memory cell transistors and memory cell capacitors using a high dielectric constant insulating film.

For example, in the case of stacked memory cells, capacitor capacitance is assured by introducing a new high dielectric constant insulating film in view of reduction in the capacitor surface area caused by miniaturization. In order to increase the capacitor capacitance of the memory cells, however, the insulating film thickness needs to be reduced to the minimum, which increases a tunneling leakage current of the capacitor insulating film. Moreover, since logic compatibility is strongly required in the miniaturization process, silicidated storage nodes are used, which increases junction leakage of the storage nodes. Therefore, the charge retention time of the memory cells is reduced and word lines need to be activated more often for a refresh operation as compared to conventional examples.

Conventionally, the refresh frequency has been increased by increasing the input frequency of an external refresh command (such as an auto refresh command) to a DRAM. In this case, however, the access efficiency of external read/write access to the DRAM is effectively reduced and the system performance is limited. For example, in the case of refreshing a DRAM having a charge retention time of 1 millisecond (ms) and 4096 word lines, an external auto refresh command needs to be applied every 244 nanoseconds (ns). In the case where the DRAM has a random cycle of 100 ns, a refresh command needs to be applied every two cycles.

There is also a technology of reducing the input frequency of an external refresh command by activating a plurality of word lines in a DRAM in response to an external refresh command. However, activating many memory blocks at the same time increases an instantaneous current, causing reduction in an operation margin due to a power supply voltage drop and noise. Therefore, the maximum number of word lines that can be activated at the same time is limited. Accordingly, when the charge retention time of memory cells is reduced, it is inevitable to increase the input frequency of an external refresh command.

In view of the above technologies, Japanese Laid-Open Patent Publication No. 2005-203092 (Patent document 1) describes a technology of simultaneously refreshing a memory block that is not externally read/write accessed (a memory block that is not externally accessed) during a normal read/write access period.

FIG. 26 is a block diagram showing a structure of a main part of a conventional semiconductor memory device described in Patent document 1.

In FIG. 26, RAC indicates a row address counter; banks 0, 1, ..., 14, and 15 indicate a memory bank; WADD<6:0> indicates a word line address; WRAC<6:0> indicates a refresh word line address; BSEL<15:0> indicates a bank select signal; and RBSEL<15:0> indicates a refresh bank select signal.

In this structure, a memory bank that is different from the one designated by the bank select signal BSEL<15:0> is selected by the refresh bank select signal RBSEL<15:0>, whereby refresh can be conducted simultaneously with external access. In the case where an externally accessed memory bank conflicts with a memory bank to be refreshed, the memory bank cannot be refreshed. Such a bank conflict is avoided by a system (not shown) having the semiconductor memory device.

Of the word lines in each memory bank, word lines that have already been refreshed are independently stored in the row address counters RAC respectively corresponding to the memory banks. Since the row address counters RAC thus manage the addresses of word lines to be refreshed in the respective memory banks, the system does not need to consider the management of addresses of word lines in each memory bank.

Accordingly, in the technology described in Patent document 1, all the memory cells in the plurality of memory banks in the semiconductor memory device can be refreshed by merely applying the refresh bank select signal RBSEL<15:0> to each memory bank while avoiding a predetermined number of bank conflicts. For example, in the case where each memory bank includes 128 word lines, refresh of all the memory cells is assured by avoiding bank conflicts by the system so that 128 refresh commands are applied to each memory bank within the charge retention time of the memory cells.

However, in a semiconductor memory device that does not have a memory bank structure, a system having the semiconductor memory device cannot access memory blocks in the semiconductor memory device on a block-by-block basis. Therefore, it is impossible for the system to arbitrate a conflict between access to an external access memory block (an externally accessed memory block) and access to an internal refresh memory block (a memory block to be internally refreshed) by the technology described in Patent document 1.

In the technology of Patent document 1, the row address counters respectively corresponding to the memory banks are dispersedly located within the semiconductor memory device, resulting in increase in the area of the semiconductor memory device.

Moreover, in the case where the system conducts refresh management while considering only the bank conflicts, the system does not recognize refresh information of the word lines in each memory bank. Therefore, the refresh bank select signal RBSEL<15:0> is continuously applied to the semiconductor memory device. As a result, refresh is conducted more than a required number of times within the charge retention time of the memory cells, resulting in increase in current consumption. In order to avoid this problem, complicated refresh management by the system or internal control of the DRAM are necessary to stop the refresh operation. However, Patent document 1 does not disclose such management and control.

SUMMARY OF THE INVENTION

It is an object of the invention to implement, with a reduced area, a semiconductor memory device capable of arbitrating conflicts between various external accesses (such as a normal random operation, a page access, a precharge operation, and a mixed access of these operations) and internal simultaneous refresh even when the semiconductor memory device does not have a memory bank structure, without requiring a system having the semiconductor memory device to consider internal refresh word line addresses. It is another object of the invention to ensure that refresh of all the memory cells is completed at the minimum required number of times within the charge retention time of the memory cells.

In order to achieve the above objects, according to the invention, a semiconductor memory device includes a plurality of memory blocks each having a plurality of word lines, wherein only one of the plurality of memory blocks is activated simultaneously. The semiconductor memory device further includes a plurality of refresh block counters for selecting at least two memory blocks to be refreshed from the plurality of memory blocks, a refresh word line counter for generating a common word line address that is common to the at least two memory blocks, and an arbitration circuit for arbitrating between external access and internal refresh. In this semiconductor memory device, at least one first word line address indicating a memory block to be refreshed and a word line in that memory block is generated by using the plurality of refresh block counters and the refresh word line counter. Arbitration is conducted so that a word line indicated by the at least one first word line address is refreshed during a period in which a word line in a memory block in the semiconductor memory device is externally accessed.

More specifically, a semiconductor memory device according to the invention includes: a plurality of memory blocks each including a plurality of memory cells arranged in a matrix pattern, a plurality of word lines respectively corresponding to rows of the plurality of memory cells, a plurality of bit lines respectively corresponding to columns of the plurality of memory cells, and a plurality of sense amplifiers respectively corresponding to the columns of the plurality of memory cells, wherein one of the plurality of word lines is activated simultaneously. The semiconductor memory device further includes: a plurality of refresh block counters for generating block addresses of at least two memory blocks to select at least two memory blocks to be refreshed from the plurality of memory blocks; a refresh word line counter for generating a common word line address that is common to the at least two memory blocks; and an arbitration circuit for generating at least one first word line address based on the at least two block addresses and the common word line address and arbitrating so that each word line indicated by the at least one first word line address is refreshed during a period in which a word line indicated by an externally applied second word line address is accessed.

In the semiconductor memory device, it is preferable that the arbitration circuit arbitrates so that, when one of the at least two memory blocks selected by the plurality of refresh block counters matches a memory block that corresponds to the second word line address and that is externally accessed, refresh of the one of the at least two memory blocks is stopped.

In the semiconductor memory device, it is preferable that a count operation of the plurality of refresh block counters is performed every time refresh is performed, and that the refresh word line counter is counted up after refresh of all the memory blocks is completed.

In the semiconductor memory device, it is preferable that an external refresh request is applied to the semiconductor memory device in every predetermined period, and that the predetermined period is a period in which a number of unrefreshed memory blocks in the semiconductor memory device becomes at most one.

In the semiconductor memory device, it is preferable that, when the external refresh request is applied to the semiconductor memory device, a block address of an unrefreshed memory block is stored as a common address in each of the plurality of refresh block counters.

In the semiconductor memory device, it is preferable that, every time the external refresh request is applied to the semiconductor memory device, the plurality of refresh block counters are reset and the refresh word line counter is counted up.

In the semiconductor memory device, it is preferable that a dummy external refresh request is applied to the semiconductor memory device right before a normal operation is started after a power supply is turned on or the semiconductor memory device is restored from self refresh.

In the semiconductor memory device, it is preferable that a count operation of the plurality of refresh block counters is performed every time refresh is performed, and that after refresh of all the memory blocks is completed, the arbitration circuit arbitrates so that an internal refresh operation is stopped until the refresh word line counter is counted up next.

In the semiconductor memory device, it is preferable that the plurality of refresh block counters are a pair of an increment counter and a decrement counter.

In the semiconductor memory device, it is preferable that, when a value of the increment counter exceeds a value of the decrement counter, the arbitration circuit generates a flag indicating that refresh of all the memory blocks is completed.

In the semiconductor memory device, it is preferable that, when an external refresh request is applied to the semiconductor memory device and a value of the increment counter matches a value of the decrement counter, the arbitration circuit arbitrates so that a memory block indicated by the increment counter and the decrement counter is refreshed in an external refresh access cycle.

In the semiconductor memory device, it is preferable that, in a self refresh operation, the plurality of refresh block counters are switched so that a count operation of the plurality of refresh block counters is performed according to a carry output signal of the refresh word line counter.

In the semiconductor memory device, it is preferable that a count operation of the plurality of refresh block counters and the refresh word line counter is performed in a self refresh period.

In the semiconductor memory device, it is preferable that, by external control of the semiconductor memory device, the plurality of refresh block counters are switched so that a count operation of the plurality of refresh block counters is performed according to a carry output signal of the refresh word line counter.

Preferably, the semiconductor memory device further includes a storage section for storing the second word line address externally supplied to the semiconductor memory device. It is preferable that the arbitration circuit compares the at least one first word line address with at least one second word line address stored in the storage section, and that when the first word line address matches the at least one second word line address, the arbitration circuit arbitrates so that refresh of a word line indicated by the at least one first word line address is skipped.

In the semiconductor memory device, it is preferable that the storage section includes a storage section for storing an external access memory block address and a storage section for storing a match flag of the first and second word line addresses.

In the semiconductor memory device, it is preferable that the storage section is reset every time an external refresh request is applied to the semiconductor memory device.

In the semiconductor memory device, it is preferable that the at least one first word line address is transmitted through a first predecode signal line and the second word line address is transmitted through a second predecode signal line, and that a number of first predecode signal lines is equal to a number of second predecode signal lines.

In the semiconductor memory device, it is preferable that the plurality of refresh block counters are a plurality of pairs of an increment counter and a decrement counter, and that one of the plurality of pairs of an increment counter and a decrement counter is assigned to each of a plurality of regions in a plurality of memory arrays formed by the plurality of memory cells.

In the semiconductor memory device, it is preferable that the arbitration circuit arbitrates so that each word line indicated by the at least one first word line address is refreshed during a page access period in which the semiconductor memory device is externally accessed.

In the semiconductor memory device, it is preferable that, when a precharge period is detected, the arbitration circuit arbitrates so that word lines indicated by a plurality of first word line addresses are simultaneously refreshed.

Another semiconductor memory device according to the invention includes a plurality of memory blocks each including a plurality of memory cells arranged in a matrix pattern, a plurality of word lines respectively corresponding to rows of the plurality of memory cells, a plurality of bit lines respectively corresponding to columns of the plurality of memory cells, and a plurality of sense amplifiers respectively corresponding to the columns of the plurality of memory cells, wherein one of the plurality of word lines is activated simultaneously. The semiconductor memory device further includes: a plurality of refresh block counters for generating a block address that is common to the plurality of memory blocks; a refresh word line counter for generating a common word line address that is common to at least two of the plurality of memory blocks; and an arbitration circuit for generating at least one first word line address based on the block address and the common word line address and arbitrating so that each word line indicated by the at least one first word line address is refreshed during a period in which a word line indicated by an externally applied second word line address is accessed.

In the another semiconductor memory device, it is preferable that the arbitration circuit arbitrates so that each word line indicated by the at least one first word line address is refreshed during a page access period in which the semiconductor memory device is externally accessed.

Preferably, the another semiconductor memory device further includes a row control circuit. It is preferable that the row control circuit counts a number of clock pulses during an enabled period of a row access command signal that is externally applied over a plurality of cycles, and generates an internal simultaneous refresh command every predetermined number of pulses.

In the another semiconductor memory device, it is preferable that the row control circuit counts a number of clock pulses during a disabled period of a row access command signal that is externally applied, and generates an internal simultaneous refresh command every predetermined number of pulses.

In the another semiconductor memory device, it is preferable that a number of input clock pulses that are applied to the semiconductor memory device during a precharge period of the semiconductor memory device is at most a predetermined limit value.

In the another semiconductor memory device, it is preferable that, when a minimum random cycle is two clock cycles, the number of input clock pulses that are applied to the semiconductor memory device during the precharge period is an odd number.

In the another semiconductor memory device, it is preferable that, when a minimum random cycle is two clock cycles and the number of input clock pulses that are applied to the semiconductor memory device during the precharge period is at least a predetermined value, the number of input clock pulses during the precharge period is an odd number.

In the another semiconductor memory device, it is preferable that, when a precharge period is detected, the arbitration circuit arbitrates so that word lines indicated by a plurality of first word line addresses are simultaneously refreshed.

According to the invention, a method for stopping an internal refresh operation in a semiconductor memory device including a plurality of memory blocks each including a plurality of memory cells arranged in a matrix pattern, a plurality of word lines, a plurality of bit lines, and a plurality of sense amplifiers, wherein one of the plurality of word lines is activated simultaneously, includes the steps of: comparing respective counter values of a plurality of block counters for generating an address for sequentially internally refreshing the plurality of memory blocks; and stopping a refresh operation based on the comparison result.

Preferably, the method for stopping an internal refresh operation further includes the steps of: when the plurality of block counters are one or more pairs of an increment counter and a decrement counter, performing a count operation of the increment counter and the decrement counter every time internal refresh is performed and comparing a counter value of the increment counter with a counter value of the decrement counter; and stopping an internal refresh operation when the counter value of the increment counter exceeds the counter value of the decrement counter.

In the method for stopping an internal refresh operation, it is preferable that the internal refresh operation is stopped until an external refresh command is generated.

According to the invention, a method for processing a conflict between external access and internal refresh in a semiconductor memory device including a plurality of memory blocks and a plurality of block counters for generating an address for sequentially internally refreshing the plurality of memory blocks, wherein each of the plurality of memory blocks includes a plurality of memory cells arranged in a matrix pattern, a plurality of word lines, a plurality of bit lines, and a plurality of sense amplifiers, and one of the plurality of word lines is activated simultaneously, includes the steps of: detecting a conflict between an external access memory block and an internal refresh memory block; and stopping an internal refresh operation and a count operation of the block counters when the conflict is detected in the detecting step.

In the method for processing a conflict between external access and internal refresh, it is preferable that, when a conflict between an external access memory block and an internal refresh memory block continues until external refresh, the conflict memory block is refreshed in an external refresh cycle.

According to the invention, a counter initializing method in a semiconductor memory device including a plurality of memory blocks and a plurality of block counters for generating an address for sequentially internally refreshing the plurality of memory blocks, wherein each of the plurality of memory blocks includes a plurality of memory cells arranged in a matrix pattern, a plurality of word lines, a plurality of bit lines, and a plurality of sense amplifiers, and one of the plurality of word lines is activated simultaneously, includes the steps of: detecting input of an external refresh command; and initializing the plurality of block counters when input of the external refresh command is detected in the detecting step.

According to the invention, a method for detecting a refresh address of external refresh in a semiconductor memory device including a plurality of memory blocks and a plurality of block counters for generating an address for sequentially internally refreshing the plurality of memory blocks, wherein each of the plurality of memory blocks includes a plurality of memory cells arranged in a matrix pattern, a plurality of word lines, a plurality of bit lines, and a plurality of sense amplifiers, and one of the plurality of word lines is activated simultaneously, includes the steps of: detecting an external refresh cycle; and refreshing an address that is common to the plurality of block counters when the external refresh cycle is detected in the detecting step.

According to the invention, a method for selecting execution of an external refresh operation in a semiconductor memory device including a plurality of memory blocks and a plurality of block counters for generating an address for sequentially internally refreshing the plurality of memory blocks, wherein each of the plurality of memory blocks includes a plurality of memory cells arranged in a matrix pattern, a plurality of word lines, a plurality of bit lines, and a plurality of sense amplifiers, and one of the plurality of word lines is activated simultaneously, includes the steps of: when the plurality of block counters are one or more pairs of an increment counter and a decrement counter, performing a count operation of the increment counter and the decrement counter every time internal refresh is performed and comparing a counter value of the increment counter with a counter value of the decrement counter; and performing an external refresh operation when the counter value of the increment counter is equal to the counter value of the decrement counter in the comparing step.

According to the semiconductor memory device of the invention, at least one first word line address (refresh address) indicating a memory block to be refreshed and a word line in that memory block is generated by using the plurality of refresh block counters for generating block addresses of at least two memory blocks and the refresh word line counter for generating a common word line address (a block word line address) that is common to the plurality of memory blocks. Therefore, even in a semiconductor memory device that does not have a memory bank structure, arbitration between a memory block to be externally accessed (an external access block) and a memory block to be refreshed (an internal refresh memory block) can be conducted by, for example, comparing an external access memory block with a memory block indicated by the refresh block counters. Moreover, even when an external access block conflicts with an internal refresh memory block, a word line indicated by a first word line address other than the conflicting first word line address can be refreshed. Therefore, refresh can be performed simultaneously with external access. Moreover, the refresh block counters and the refresh word line counter are not provided in each memory block but are shared by the plurality of memory blocks in the semiconductor memory device. Therefore, reduction in area can be implemented.

In the case where one of a plurality of memory blocks to be refreshed matches a memory block to be externally accessed, refresh of this memory block is stopped, but the remainder of the plurality of memory blocks to be refreshed is refreshed. Therefore, arbitration can be conducted so that a word line in at least one memory block is refreshed simultaneously with external access.

In the case where an external access block conflicts with an internal refresh memory block, a count operation of the corresponding refresh block counter is not performed. Therefore, the unrefreshed memory block can be stored, and refresh of all the memory blocks for a specific block word line address can be reliably completed.

Right before a cycle in which an external refresh request (an external refresh command) is applied in a predetermined period, a word line of at most one block has not been refreshed for a specific block word line address. Therefore, this unrefreshed word line can be refreshed in the external auto refresh cycle, whereby refresh of all the blocks for a specific block word line address can be reliably completed within an external refresh period.

The refresh block counters have a function to store an unrefreshed memory block. This eliminates the need for an excessive storage register, and control is facilitated.

Since the refresh block counters are reset and the refresh word line counter is counted up in response to input of an external refresh command, the number of external accesses does not need to be counted within the semiconductor memory device. Accordingly, circuits such as a count circuit can be omitted, whereby reduction in area can be implemented.

The refresh counters are reset right before a normal operation is started after the power supply is turned on or the semiconductor memory device is restored from self refresh. Therefore, it is ensured that all the blocks other than at most one block have already been refreshed at the time of the next refresh input.

Internal refresh is stopped when all the blocks have been refreshed for a specific block word line address within a period of an external refresh command. Therefore, unnecessary refresh can be prevented, whereby reduction in power consumption can be implemented. At the same time, all the word lines are ensured to be refreshed within the charge retention time.

Arbitration between an external access block and an internal refresh memory block can be conducted by the refresh block counters formed by a pair of an increment counter and a decrement counter.

Moreover, completion of refresh of all the memory blocks can be detected by a simple logic circuit.

Detecting and holding a block address when the value of the increment counter matches the value of the decrement counter can be easily implemented as a section for detecting and holding a block address of a memory block that has not been refreshed. Since the number of unrefreshed blocks is at most only one upon input of an external refresh request, refresh of all the memory blocks for a specific block word line address can be reliably completed within an external refresh period.

In a normal operation, operation of the refresh block counters is triggered by an external clock and operation of the refresh word line counter is triggered by an external refresh command that is applied every predetermined period. For a self refresh operation, however, there are no such triggers, but the refresh word line counter and the refresh block counters operate cooperatively to perform a count operation. Therefore, auto refresh can be performed by generating a single internal trigger.

In a self refresh operation in which an external refresh command as a trigger of counter control is not applied, the counters can perform a count operation in a self refresh period. Auto refresh can thus be performed.

In a normal operation, an external refresh command needs to be applied every predetermined period. Depending on how the system having the semiconductor memory device is used, however, in a specific operation pattern, there may be a case where the overhead is smaller when intensive refresh is performed. Therefore, optimal system performance can be obtained by controlling simultaneous refresh and intensive refresh by the system. By using this control in a test operation, the simultaneous refresh function and the intensive refresh function can be confirmed before shipment of products.

In the case where a word line to be refreshed is externally accessed first within the charge retention time, it is equivalent that this word line has been refreshed. Therefore, refresh of the corresponding memory block is skipped, whereby excessive power consumption can be suppressed.

Moreover, since the storage section stores only a part of the second word addresses, increase in area of the storage section is suppressed, whereby reduction in area can be implemented.

Since the number of bits can be suppressed as compared to the case of storing the word line addresses to be accessed within an external refresh request period, reduction in area can be implemented.

Even when a plurality of refresh memory blocks are to be refreshed simultaneously, a memory block selection predecode signal line can be shared, whereby increase in area can be minimized.

The number of memory blocks to be simultaneously refreshed during external access can be increased. Therefore, even when there are many memory blocks or the random cycle time is slow, refresh of all the memory blocks other than at most one memory block can be reliably completed within an external refresh interval, and refresh of all the memory blocks for a specific block word line address can be completed within an external refresh period.

According to the another semiconductor memory device of the invention, the number of memory blocks to be simultaneously refreshed during external access and during an external refresh operation can be increased. Therefore, even when there are many memory blocks or the random cycle time is slow, refresh of all the memory blocks other than at most one memory block can be reliably completed within an external refresh interval, and predetermined refresh of all the memory blocks can be completed within an external refresh period.

Even when the same memory block is continuously accessed during a page access, the memory blocks other than this memory block can be refreshed. Therefore, simultaneous internal refresh can be performed even during the page access.

By detecting a state in which there is no external access and performing internal refresh regardless of whether there is an external access or not, refresh of all the memory cells can be reliably completed within the charge retention time of the memory cells by merely applying an auto refresh command in a predetermined refresh period. It is not necessary to manage an operation so that internal access is conducted from the outside.

Simultaneous refresh can be performed for any page length.

In the case where the minimum random cycle is 2 clock cycles, simultaneous refresh can be performed for any page length.

In the case where the minimum random cycle is 2 clock cycles, simultaneous refresh is performed for any page length, while eliminating such read/write access restrictions that limit system performance. Internal refresh can be performed when a precharge period is long enough for the system to switch to a standby state.

In the method for stopping an internal refresh operation according to the invention, completion of refresh of all the blocks for a specific block word line address can be easily detected.

Moreover, refresh can be prevented from being performed more than a minimum required number of times within the charge retention time of the memory cells. Therefore, reduction in power consumption can be achieved.

In the method for processing a conflict between external access and internal refresh according to the invention, data can be prevented from being damaged by performing external access and internal refresh on the same word line. An unrefreshed block address is stored as a counter address, and refresh of a non-conflicting block counter address can be performed.

Moreover, it is assured that refresh of all the blocks for a specific block word line address is completed in an external refresh period.

In the counter initializing method according to the invention, counter initialization can be implemented in a simplified manner.

In the method for detecting a refresh address of external refresh according to the invention, the only unrefreshed block address stored in the block counters can be reliably refreshed in an external refresh cycle.

In the method for selecting execution of an external refresh operation according to the invention, the only unrefreshed block address stored in the block counters can be reliably refreshed in an external refresh cycle. It is assured that refresh of all the blocks for a specific block word line address is completed in an external refresh period.

According to the invention, in a semiconductor memory device that does not have a memory bank structure, external access and internal refresh can be simultaneously performed with a reduced area and reduced power consumption without requiring a system having the semiconductor memory device to consider internal refresh addresses.

DETAILED DESCRIPTION OF THE PREFERRED EMBODIMENTS

Hereinafter, embodiments of the invention will be described with reference to the accompanying drawings.

First Embodiment

A semiconductor memory device according to a first embodiment of the invention will now be described with reference to the figures.

Figure 1:
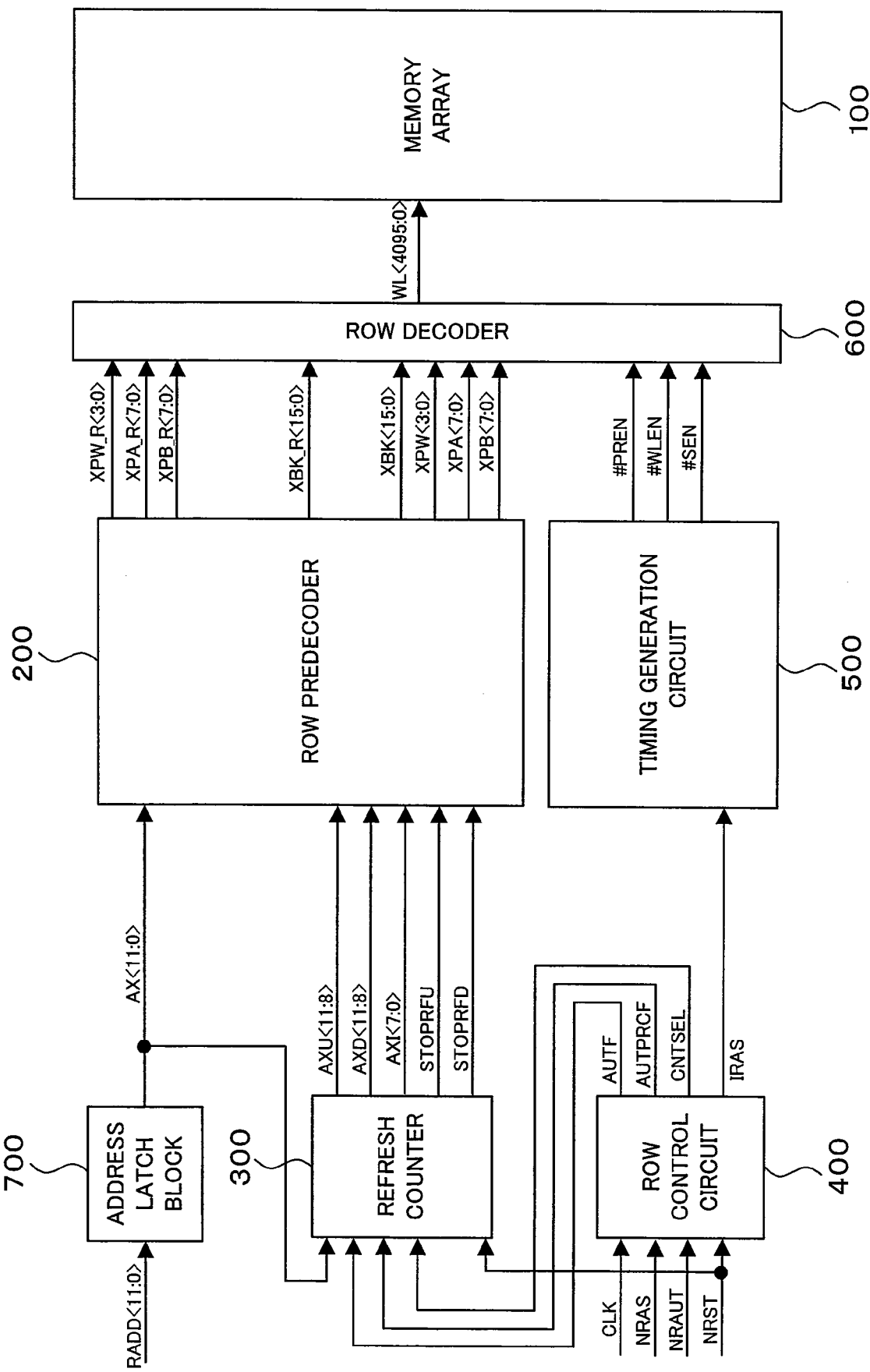
FIG. 1 is a block diagram showing an overall structure of a semiconductor memory device according to a first embodiment of the invention.

FIG. 1 is a block diagram showing an overall structure of the semiconductor memory device of the first embodiment.

In FIG. 1, 100 indicates a memory array; 200 indicates a row predecoder (an arbitration circuit); 300 indicates a refresh counter; 400 indicates a row control circuit; 500 indicates a timing generation circuit; 600 indicates a row decoder (an arbitration circuit); and 700 indicates an address latch block.

An external row address (a second word line address) RADD<11:0> is applied from the outside of the semiconductor memory device to the address latch block 700, and an external row address latch signal AX<11:0> is applied from the address latch block 700 to the row predecoder 200 and the refresh counter 300.

An external clock CLK, an external RAS (Row Address Strobe) command signal NRAS, an external auto refresh command signal NRAUT, and an external reset signal NRST are applied from the outside of the semiconductor memory device to the row control circuit 400. The external reset signal NRST is applied also to the refresh counter 300.

An auto refresh flag AUTF, an auto refresh/precharge flag AUTPRCF, and a counter select signal CNTSEL are applied from the row control circuit 400 to the refresh counter 300, and an internal RAS signal IRAS is applied from the row control circuit 400 to the timing generation circuit 500.

An increment refresh block counter address (a block address) AXU<11:8>, a decrement refresh block counter address (a block address) AXD<11:8>, an internal refresh word line address (a common word line address) AXI<7:0>, a refresh stop signal STOPRFU of an increment refresh block counter address, and a refresh stop signal STOPRFD of a decrement refresh block counter address are applied from the refresh counter 300 to the row predecoder 200.

Word line predecode signals XPW<3:0>, XPA<7:0>, and XPB<7:0>, refresh word line predecode signals XPW_R<3:0>, XPA_R<7:0>, and XPB_R<7:0>, a block selection signal XBK<15:0>, and a refresh block selection signal XBK_R<15:0> are applied from the row predecoder 200 to the row decoder 600. A precharge timing signal #PREN, a word line timing signal #WLEN, and a sense amplifier timing signal #SEN are applied from the timing generation circuit 500 to the row decoder 600.

The row decoder 600 and the memory array 100 are connected to each other by word lines WL<4095:0>.

In the semiconductor memory device of this embodiment, two sets of word line predecode signals: the word line predecode signals XPW<3:0>, XPA<7:0>, and XPB<7:0> based on the external row address RADD<11:0>; and the refresh word line predecode signals XPW_R<3:0>, XPA_R<7:0>, and XPB_R<7:0> based on the internal refresh word line address AXI<7:0>, are connected to the row decoder 600. The row decoder 600 generates a first word line address indicating a word line to be refreshed, based on the refresh block selection signal XBK_R<15:0> and the refresh word line predecode signals XPW_R<3:0>, XPA_R<7:0>, and XPB_R<7:0>.

Figure 2:
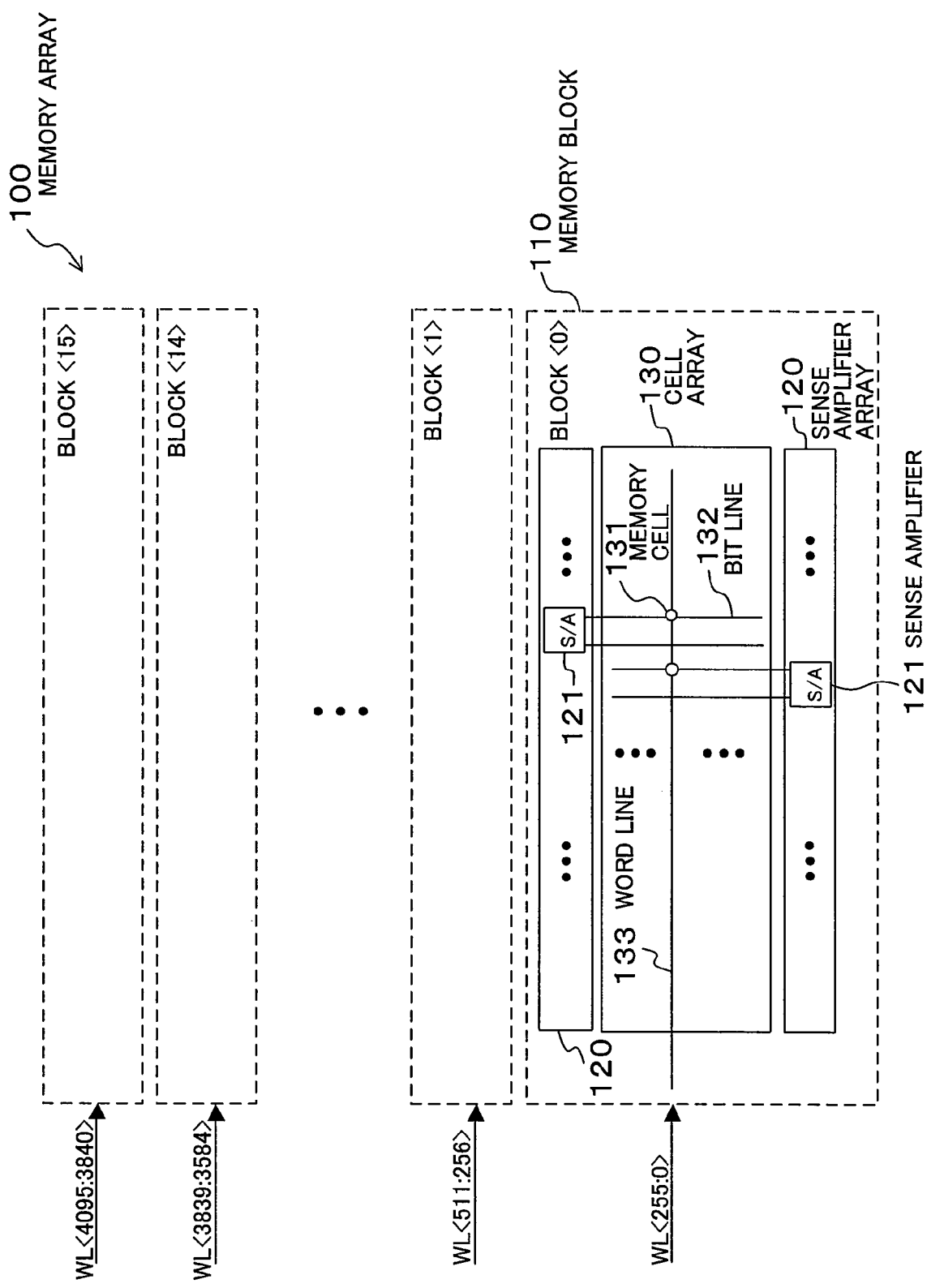
FIG. 2 is a structural diagram showing an overall structure of a memory array in the semiconductor memory device of FIG. 1.

FIG. 2 is a schematic structural diagram showing a structure of the memory array 100 in the semiconductor memory device of this embodiment.

In FIG. 2, 110 indicates a memory block; 120 indicates a sense amplifier array; 121 indicates a sense amplifier; 130 indicates a cell array; 131 indicates a memory cell; 132 indicates a bit line; and 133 indicates a word line.

The memory array 100 of this embodiment is formed by sixteen memory blocks and includes 4096 word lines WL<4095:0> with 256 word lines WL in each memory block. Only one of the plurality of word lines in each memory block is activated at the same time.

Figure 3:
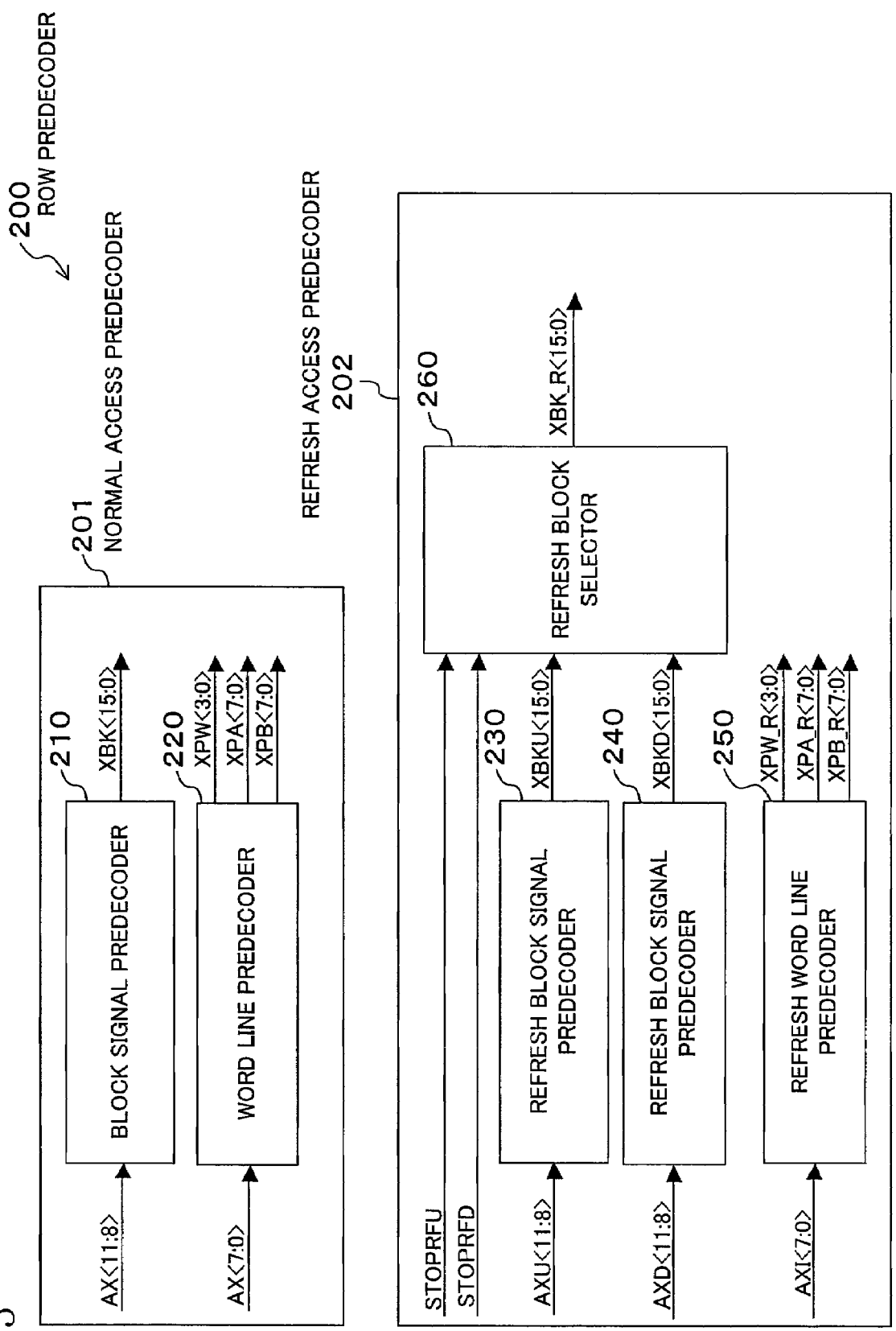
FIG. 3 is a structural diagram showing an overall structure of a row predecoder in the semiconductor memory device of FIG. 1.

FIG. 3 is a block diagram showing an overall structure of the row predecoder 200 in the semiconductor memory device of this embodiment.

In FIG. 3, 210 indicates a block signal predecoder for predecoding a block signal AX<11:8>; and 220 indicates a word line predecoder for predecoding a word line address AX<7:0>.

230 indicates a refresh block signal predecoder for predecoding a first refresh block signal (an increment refresh block counter address) AXU<11:8>; 240 indicates a refresh block signal predecoder for predecoding a second refresh block signal (a decrement refresh block counter address) AXD<11:8>; and 250 indicates a refresh word line predecoder for predecoding a refresh word line address (an internal refresh word line address) AXI<7:0>.

A refresh block predecode signal XBKU<15:0> of an increment refresh block counter from the refresh block signal predecoder 230 and a refresh block predecode signal XBKD<15:0> of a decrement refresh block counter from the refresh block signal predecoder 240 are applied to a refresh block selector 260 of a subsequent stage.

The block signal predecoder 210 and the refresh block signal predecoders 230 and 240 have the same circuit structure, and the word line predecoder 220 and the refresh word line predecoder 250 have the same circuit structure.

Figure 4:
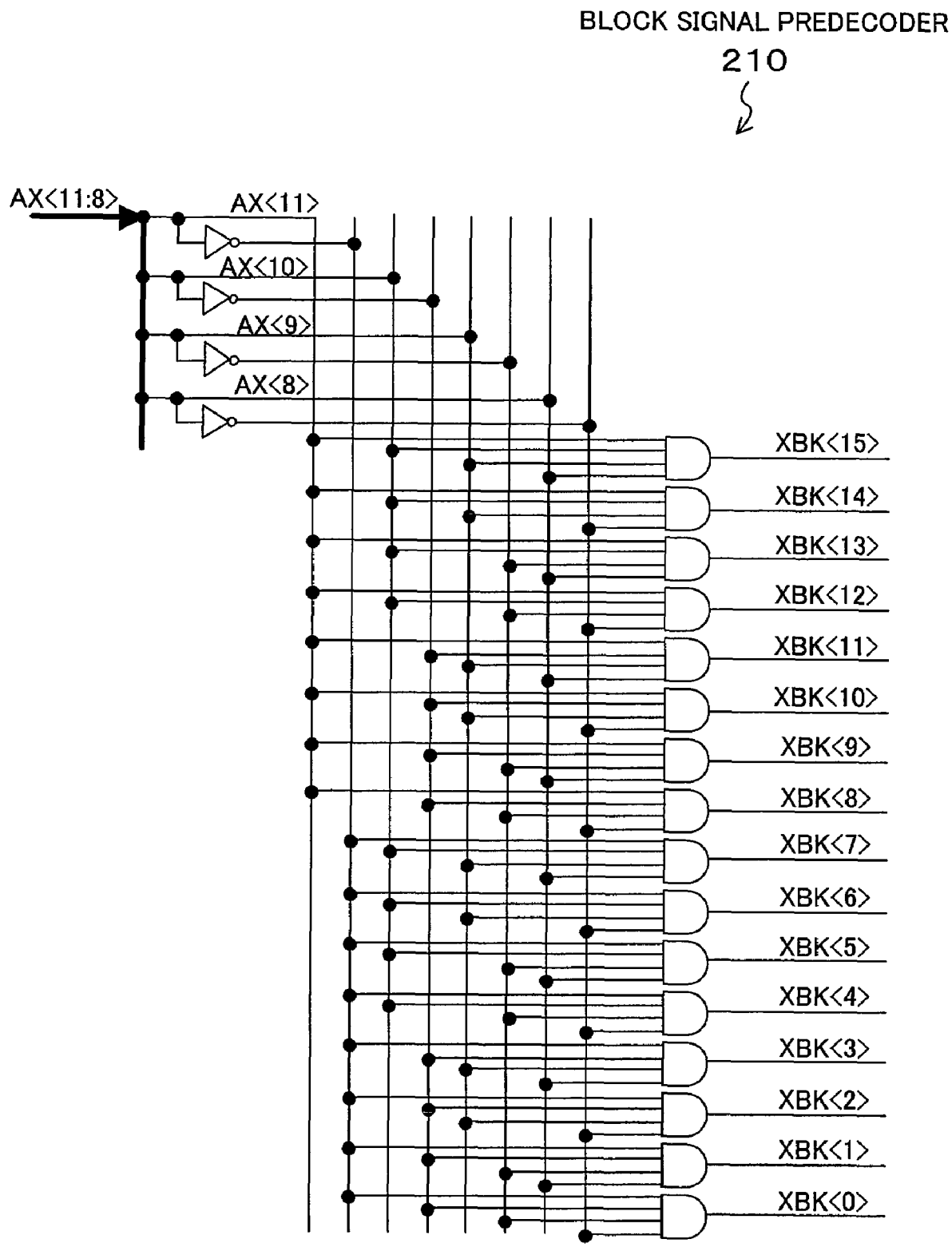
FIG. 4 is a structural diagram showing an overall structure of a block signal predecoder in the semiconductor memory device of FIG. 1.

FIG. 4 is a structural diagram showing an overall structure of the block signal predecoder 210 in the semiconductor memory device of this embodiment.

Since the block signal predecoder 210 in FIG. 4 is a commonly used decode circuit, description thereof will be omitted.

The word line predecoder 220 in the semiconductor memory device of this embodiment has the same overall structure as the block signal predecoder 210 except the number of input/output signals.

Figure 5:
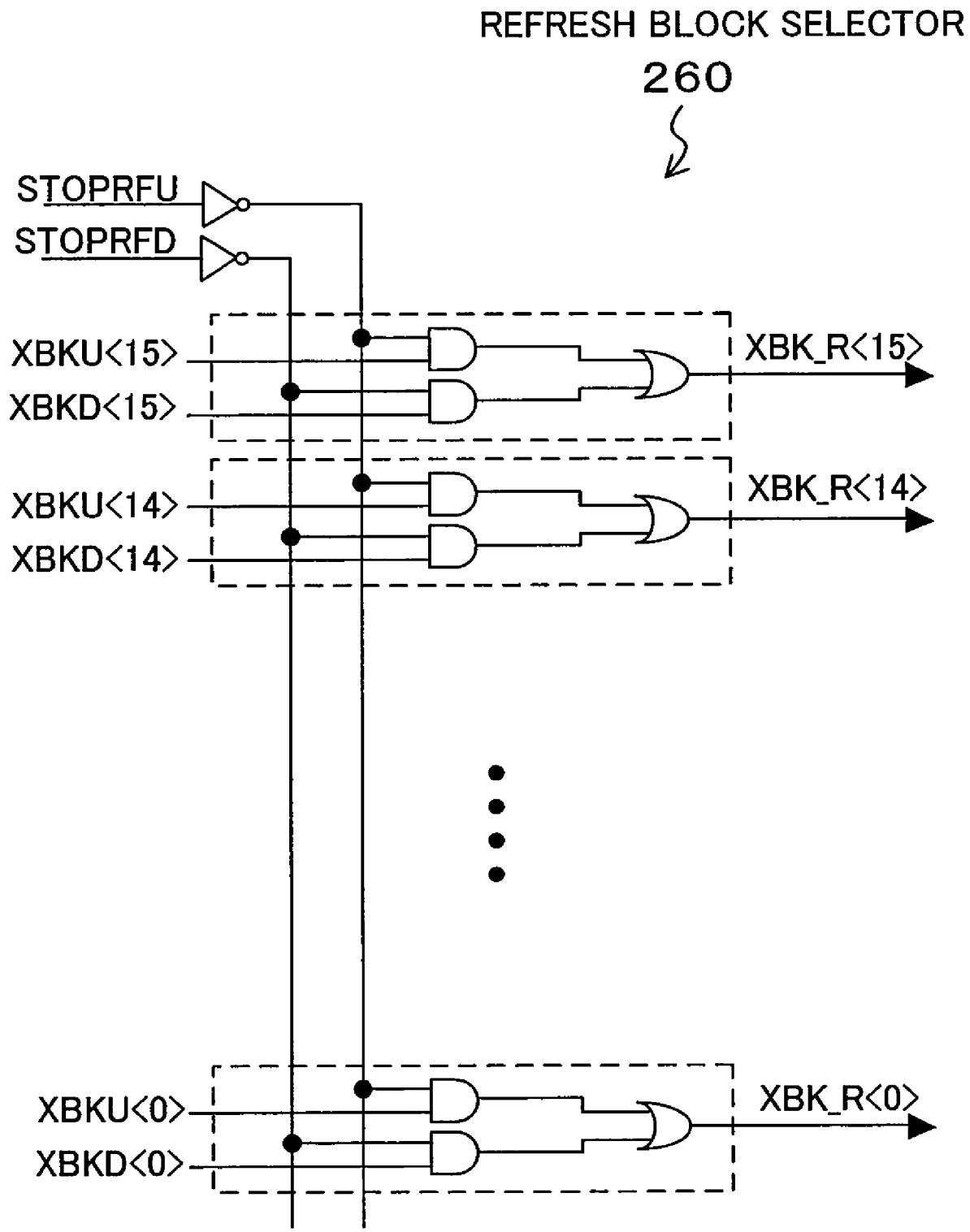
FIG. 5 is a structural diagram schematically showing a structure of a refresh block selector in the semiconductor memory device of FIG. 1.

FIG. 5 is a structural diagram schematically showing a structure of the refresh block selector 260 in the semiconductor memory device of this embodiment.

The refresh block selector 260 of FIG. 5 outputs a logical sum of the refresh block predecode signal (the first refresh block predecode signal) XBKU<15:0> of the increment refresh block counter and the refresh block predecode signal (the second refresh block predecode signal) XBKD<15:0> of the decrement refresh block counter as a refresh block selection signal XBK_R<15:0>. Therefore, even when a plurality of refresh blocks are selected, signal wirings can be shared, thereby reducing the area of the semiconductor memory device.

When the refresh stop signal STOPRFU of the increment refresh block counter address and the refresh stop signal STOPRFD of the decrement refresh block counter address are enabled, the refresh block selection signal XBK_R<15:0> can be forcibly disabled.

Figure 6:
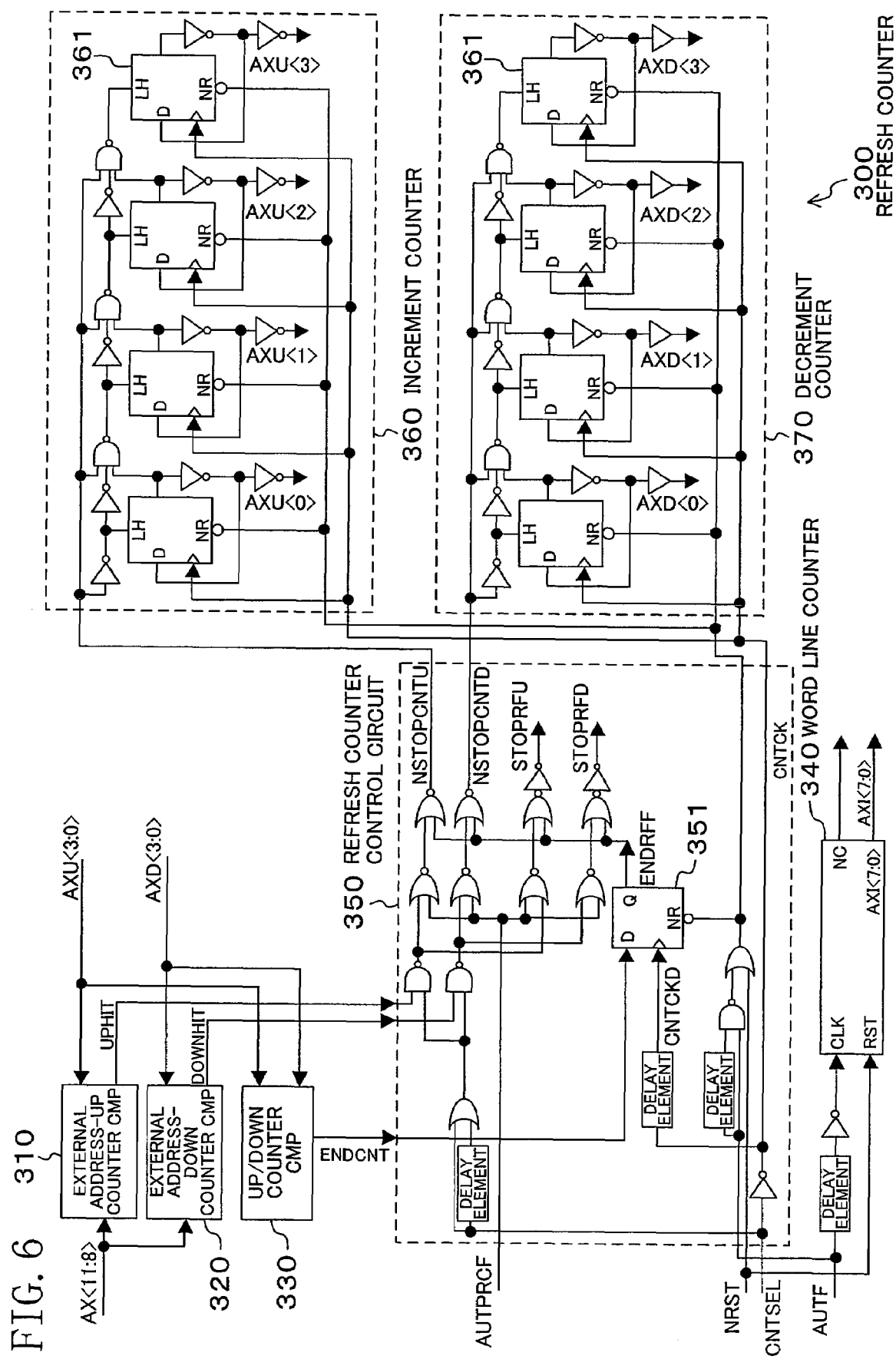
FIG. 6 is a structural diagram showing an overall structure of a refresh counter in the semiconductor memory device of FIG. 1.

FIG. 6 is a structural diagram showing an overall structure of the refresh counter 300 in the semiconductor memory device of this embodiment.

In FIG. 6, 310 indicates an external address-UP counter comparator (CMP) for comparing an external access block address AX<11:8> with an increment refresh block counter address (a first refresh block counter address) AXU<3:0>; 320 indicates an external address-DOWN counter comparator (CMP) for comparing an external access block address AX<11:8> with a decrement refresh block counter address (a second refresh block counter address) AXD<3:0>; 330 indicates an UP/DOWN counter comparator (CMP) for comparing the first and second refresh block counter addresses AXU<3:0> and AXD<3:0> with each other; 340 indicates a word line counter (a refresh word line counter); 350 indicates a refresh counter control circuit (an arbitration circuit); 351 indicates a flip-flop (F/F) with reset; 360 indicates an increment counter (a refresh block counter); 361 indicates a load hold flip-flop (F/F); and 370 indicates a decrement counter (a refresh block counter).

UPHIT indicates a match flag of the comparator 310; DOWNHIT indicates a match flag of the comparator 320; ENDCNT indicates a refresh completion signal; CNTCK indicates a counter clock; CNTCKD indicates a delayed counter clock generated by delaying the counter clock CNTCK; ENDRFF indicates a refresh completion flag; NSTOPCNTU indicates a stop flag of the increment counter 360; and NSTOPCNTD indicates a stop flag of the decrement counter 370.

In the invention, a common word line counter 340 is provided for word lines to be refreshed in all the memory blocks in the memory array 100, and a refresh block counter is formed by two counters: the increment counter 360 and the decrement counter 370. Accordingly, at most two memory blocks can be refreshed at the same time. Since a row address counter is not provided in each memory block, the area of the semiconductor memory device can be reduced.

The refresh counter control circuit 350 in the refresh counter 300 functions as described below to arbitrate a conflict between external access and internal refresh.

In the case where an address AXU<3:0> of the increment counter 360 or an address AXD<3:0> of the decrement counter 370 matches an external access block address AX<11:8>, a refresh access to the corresponding memory block and a count operation of the increment counter 360 or the decrement counter 370 are stopped. When the counter value of the increment counter 360 exceeds the counter value of the decrement counter 370, a refresh operation and a count operation are stopped. In the case where a refresh command is applied from the outside, a refresh operation is kept stopped when a refresh completion flag ENDCNT is ON and a refresh operation is performed when the refresh completion flag ENDCNT is OFF.

In each case, the word line counter 340 is counted up and the increment counter 360 and the decrement counter 370 are reset at the end of the external refresh command cycle.

Figure 7:
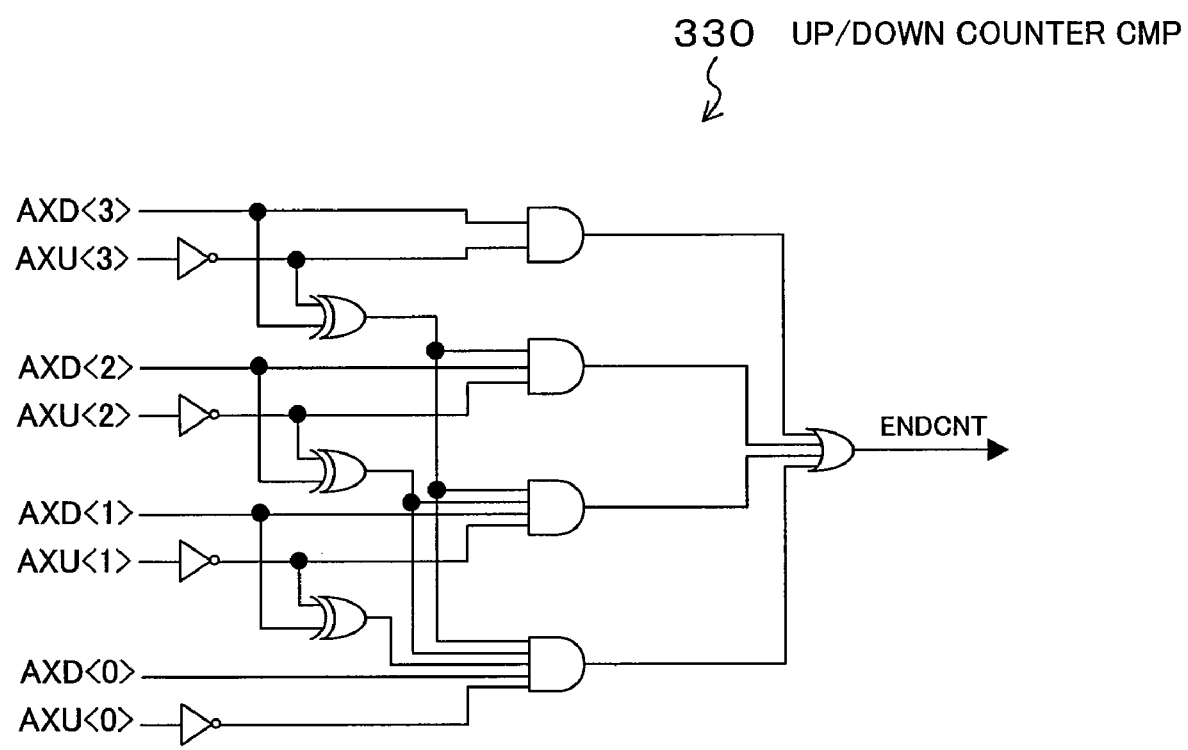
FIG. 7 is a structural diagram showing an overall structure of an UP/DOWN counter comparator in the semiconductor memory device of FIG. 1.

FIG. 7 is a structural diagram showing an overall structure of the UP/DOWN counter comparator 330 in the semiconductor memory device of this embodiment.

In FIG. 7, the refresh completion signal ENDCNT is enabled when the increment refresh block counter address AXU<3:0> exceeds the decrement refresh block counter address AXD<3:0>.

Figure 8:
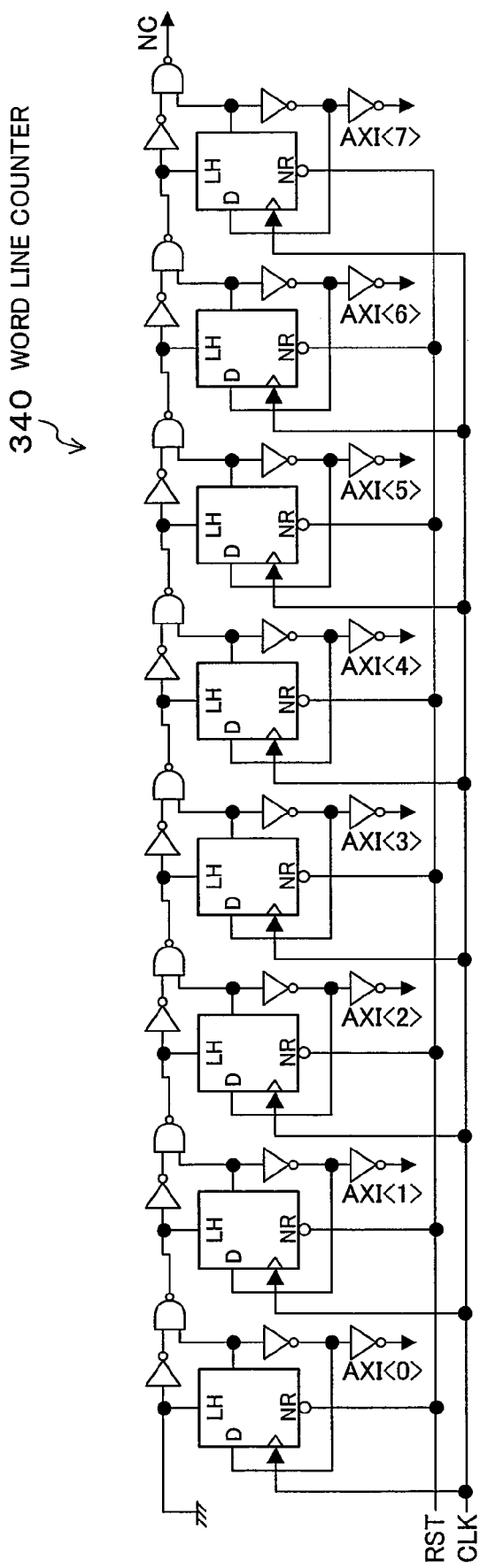
FIG. 8 is a structural diagram showing an overall structure of a word line counter in the semiconductor memory device of FIG. 1.

FIG. 8 is a structural diagram showing an overall structure of the word line counter 340 in the semiconductor memory device of this embodiment.

Since the word line counter 340 of FIG. 8 is a commonly used octal counter, description thereof will be omitted.

Figure 9:
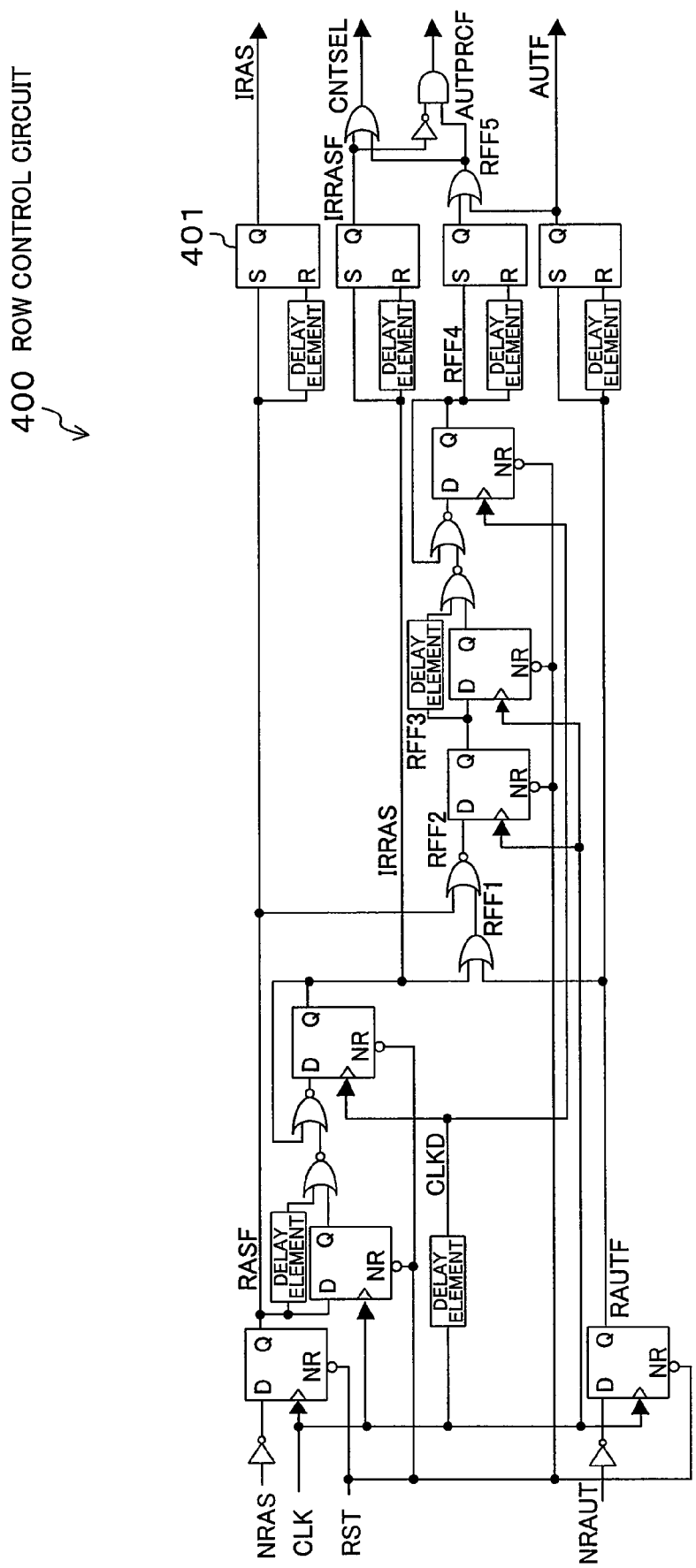
FIG. 9 is a structural diagram showing an overall structure of a row control circuit in the semiconductor memory device of FIG. 1.

FIG. 9 is a structural diagram showing an overall structure of the row control circuit 400 in the semiconductor memory device of this embodiment.

In FIG. 9, 401 indicates an R-S latch; RASF indicates an RAS flag; RAUTF indicates an auto refresh flag; IRRAS indicates an internal simultaneous refresh command;

IRRASF indicates an internal RAS flag in a random operation and a page access; and RFF1 through RFF5 indicate an internal flag.

The row control circuit 400 in FIG. 9 implements simultaneous refresh during a page access by counting the number of clock pulses during an enable period of an external RAS command signal NRAS that is applied from the outside over a plurality of cycles and generating an internal simultaneous refresh command IRRAS at every predetermined number of pulses.

The row control circuit 400 also implements auto refresh during a precharge period by counting the number of clock pulses during a disable period of the external RAS command signal NRAS and generating an internal refresh command IRRAS at every predetermined number of pulses.

Operation of the semiconductor memory device of this embodiment having the above structure will now be described.

Figure 10:
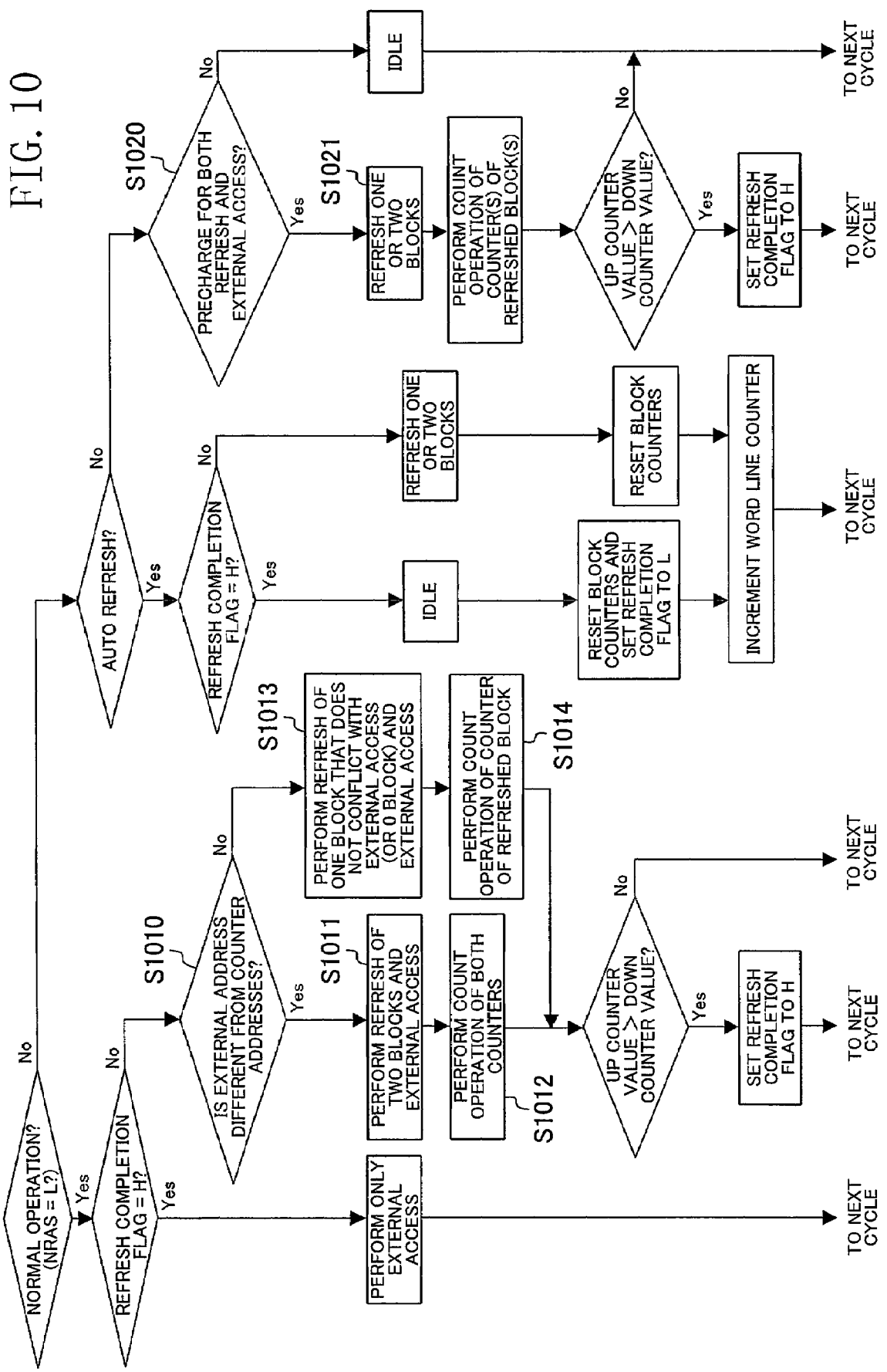
FIG. 10 is a flow chart illustrating an operation flow in the semiconductor memory device of FIG. 1.

FIG. 10 is a flow chart illustrating an operation flow in the semiconductor memory device of this embodiment.

Hereinafter, operation of a DRAM that is configured to complete an operation in a clock cycle will be described.

In an initial state, the increment counter 360 is set to a block <0> and the decrement counter 370 is set to a block <15>.

When there is an external access and this access is not an access to the block <0> or the block <15> (S1010), both blocks are refreshed (S1011). Therefore, three of the sixteen blocks (the blocks <0> and <15> and the external access block) are activated at the same time.

For example, in the case where the external access block conflicts with the refresh block of the increment counter 360, refresh of this block is stopped. In this case, since the external access block does not conflict with the refresh block of the decrement counter 370, the refresh block can be refreshed (S1013). Therefore, two of the sixteen blocks are activated at the same time.

The increment counter 360 and/or the decrement counter 370 whose block was able to be refreshed are incremented or decremented at the end of the cycle (S1012, S1014).

When a precharge operation in which there is no external access is detected (S1020), the respective blocks indicated by the increment counter 360 and the decrement counter 370 are refreshed at the same time (S1021). Therefore, two of the sixteen blocks are activated at the same time.

As described above, all the memory blocks will have been refreshed after eight cycles if there is no conflict between an external access block and a refresh block. In this case, a refresh completion flag ENDRFF is generated when it is detected that the counter value of the increment counter 360 exceeds the counter value of the decrement counter 370. The internal refresh operation is then stopped.

Even in the worst case where a conflict between an external access block and an internal refresh block continues, all the memory blocks other than the one that conflicts with an external access block will have been refreshed after fifteen cycles.

An address of the unrefreshed block is stored as a common block address of the increment counter 360 and the decrement counter 370, and this block is refreshed in an external auto refresh cycle. Refresh of all the blocks can thus be ensured.

This external refresh is applied in a predetermined period. When the refresh completion flag ENDRFF is in an enabled state, a refresh operation is kept stopped. When the refresh completion flag ENDRFF is in a disabled state, refresh is performed. In either case, the word line counter 340 is counted up and the increment counter 360 and the decrement counter 370 are reset at the end of the external refresh command cycle.

Figure 11:
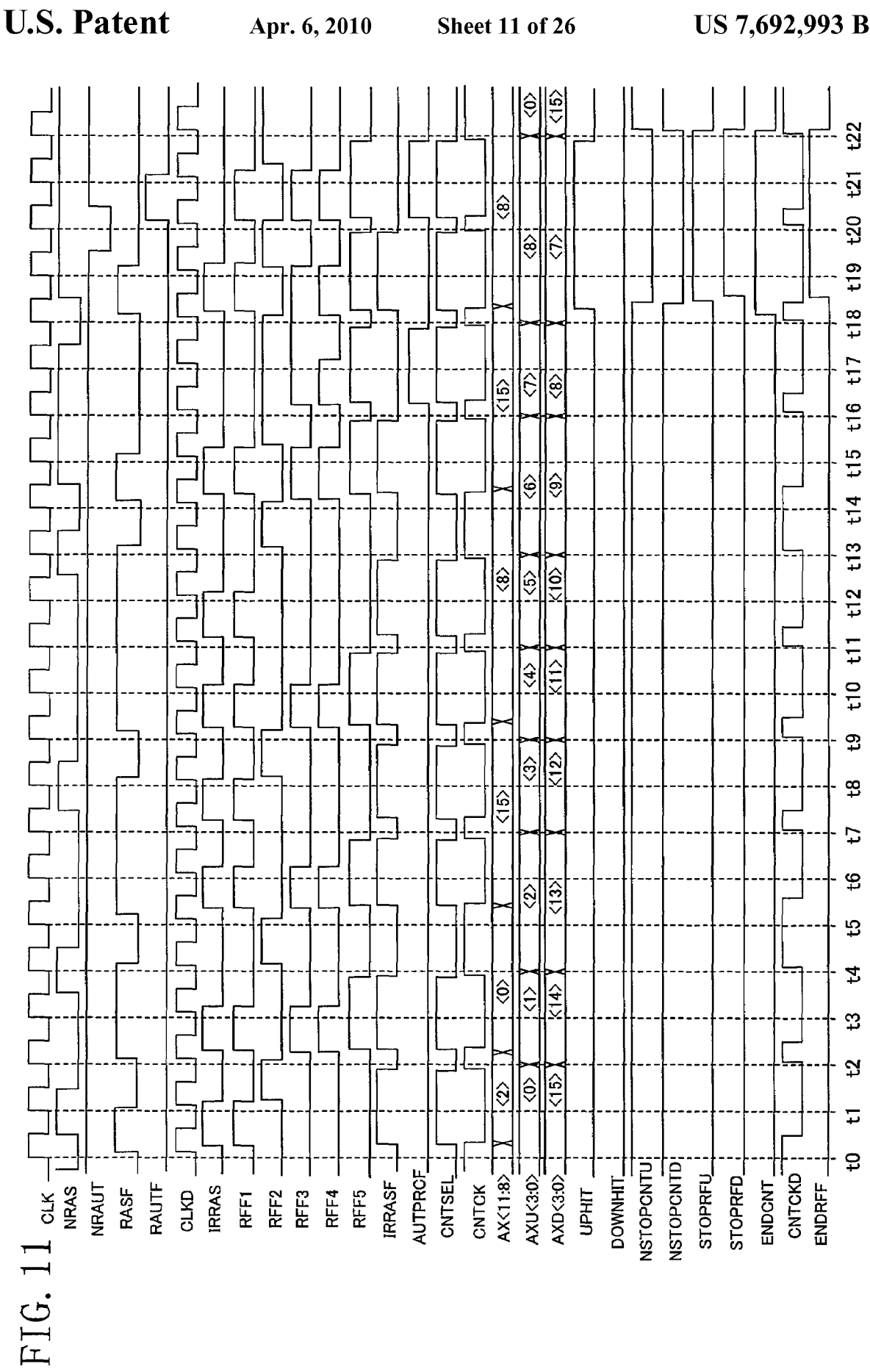
FIG. 11 is a diagram showing an operation timing of the semiconductor memory device of FIG. 1.
Figure 12:
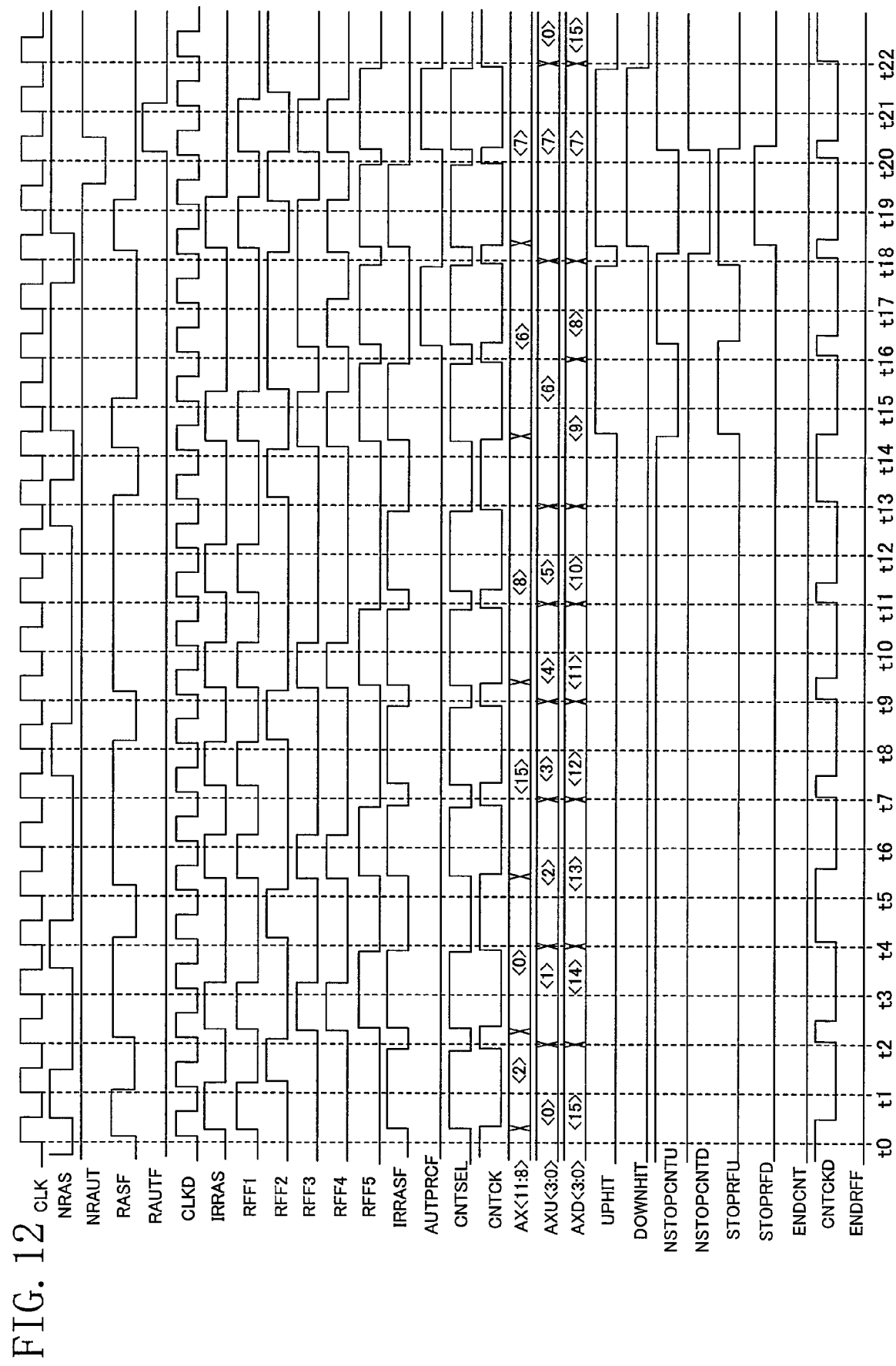
FIG. 12 is a diagram showing another operation timing of the semiconductor memory device of FIG. 1.

FIG. 11 is a diagram showing an operation timing of the semiconductor memory device of this embodiment, and FIG. 12 is a diagram showing another operation timing of the semiconductor memory device of this embodiment.

Hereinafter, operation of a DRAM having a page access function and configured to complete a cycle in two or more clock cycles will be described.

FIGS. 11 and 12 show operation timings of a DRAM having a page access function and configured to complete a random operation in two cycles; this DRAM performs a RAS operation in a first clock cycle and performs CAS (Column Address Strobe) and precharge operations in a second clock cycle.

In FIGS. 11 and 12, t0-t2 is a random access; t2-t5 is an access with a page length of 2; t5-t9 is an access with a page length of 3; t9-t14 is an access with a page length of 4; t14-t16 is a random access; t16-t18 is a precharge cycle; t18-t20 is a random cycle; and t20-t22 is an auto refresh cycle.

In FIG. 11, internal refresh is performed without conflicting with external access even during the page access period in which the semiconductor memory device is externally accessed and during the precharge period. In t16-t18, it is detected that the address AXU<3:0> of the increment counter 360 exceeds the address AXD<3:0> of the decrement counter 370 after completion of refresh in the precharge cycle. As a result, the refresh completion signal ENDCNT is enabled and the refresh operation is stopped. After the external auto refresh cycle in t20-t22, the word line counter 340 is counted up and the increment counter 360 and the decrement counter 370 are reset.

As described above, according to the invention, an internal refresh operation is stopped after refresh of all the memory blocks is completed. Therefore, unnecessary internal refresh operation is not conducted, whereby power consumption can be reduced.

FIG. 12 is different from FIG. 11 in an external input address in t14-t22 and in that the internal refresh memory block indicated by the block address of the increment counter 360 conflicts with the external access block in t14-t16 and t18-t22. Therefore, in t14-t16, UPHIT is set to "High," NSTOPCNTU is set to "Low," and STOPRFU is set to "High," and internal refresh based on the block address of the increment counter 360 is stopped and the increment counter 360 is not incremented. Since the subsequent cycle of t16-t18 is a precharge cycle, internal refresh is performed in the blocks of both block counters regardless of UPHIT and DOWNHIT. A count operation of the block counters is then performed at the end of the precharge cycle, and refresh of all the memory blocks other than the block <7> is thus completed.

In the cycle of t18-t20, refresh is not performed because the block <7> conflicts with the external access. Since the cycle of t20-t22 is an external auto refresh cycle, STOPRFU and STOPRFD are forcibly set to "Low" and the unrefreshed block <7> is refreshed.

After the external auto refresh cycle, the word line counter 340 is counted up and the increment counter 360 and the decrement counter 370 are reset.

As described above, in this embodiment, even when a conflict between an internal refresh block and an external access block continues, an auto refresh access is externally generated one time, whereby refresh of all the memory blocks is reliably completed in that cycle. In other words, by externally applying an auto refresh command in a predetermined period that is longer than a period in which "the number of memory blocks—1" internal refreshes are performed, a simultaneous refresh operation in which all the memory cells are reliably refreshed within the charge retention time can be easily implemented without managing internal addresses. For example, in the case of a DRAM having a charge retention time of 1 ms and 4096 word lines, an auto refresh command conventionally needs to be externally applied every 977 ns in order to refresh the 4096 word lines simultaneously. In the simultaneous refresh method of the invention, however, refresh of all the memory cells is assured by externally applying an auto refresh command every 3906 ns in the case of a DRAM having 16 memory blocks and 4096 word lines with 256 word lines in each memory block.

In the structure of this embodiment, 15 cycles of random operation need to be conducted within the refresh period (within the charge retention time). This can be implemented when the random cycle is faster than 260 ns. In other words, since the input frequency of an external refresh command can be reduced, system performance can be improved.

In order to ensure that refresh of all the memory blocks other than at most one memory block is completed at the time of input of an auto refresh command in the above predetermined period, it is desirable to perform a dummy auto refresh cycle right before the cycle of starting a normal operation after the power supply is turned on or the semiconductor memory device is restored from self refresh (corresponding to the cycle of t0-t2 in FIGS. 11 and 12).

In order to perform internal refresh during a page access of various page lengths and during a precharge operation, the number of clock pulses in the precharge cycle needs to be limited. In other words, refresh is completed in two cycles in the above structure. However, since at least the timing of a first clock pulse for the refresh and the timing of a first clock pulse for the external access need to match each other, the number of clock pulses in the precharge period including CAS and precharge cycles in the external access operation needs to be an odd number.

Second Embodiment

Hereinafter, a semiconductor memory device according to a second embodiment of the invention will be described with reference to the figures.

The semiconductor memory device of this embodiment is different from the semiconductor memory device of the first embodiment in that the row control circuit 400 is replaced with a row control circuit 1400. Since the structure is otherwise the same as the first embodiment, illustration and description thereof will be omitted.

Figure 13:
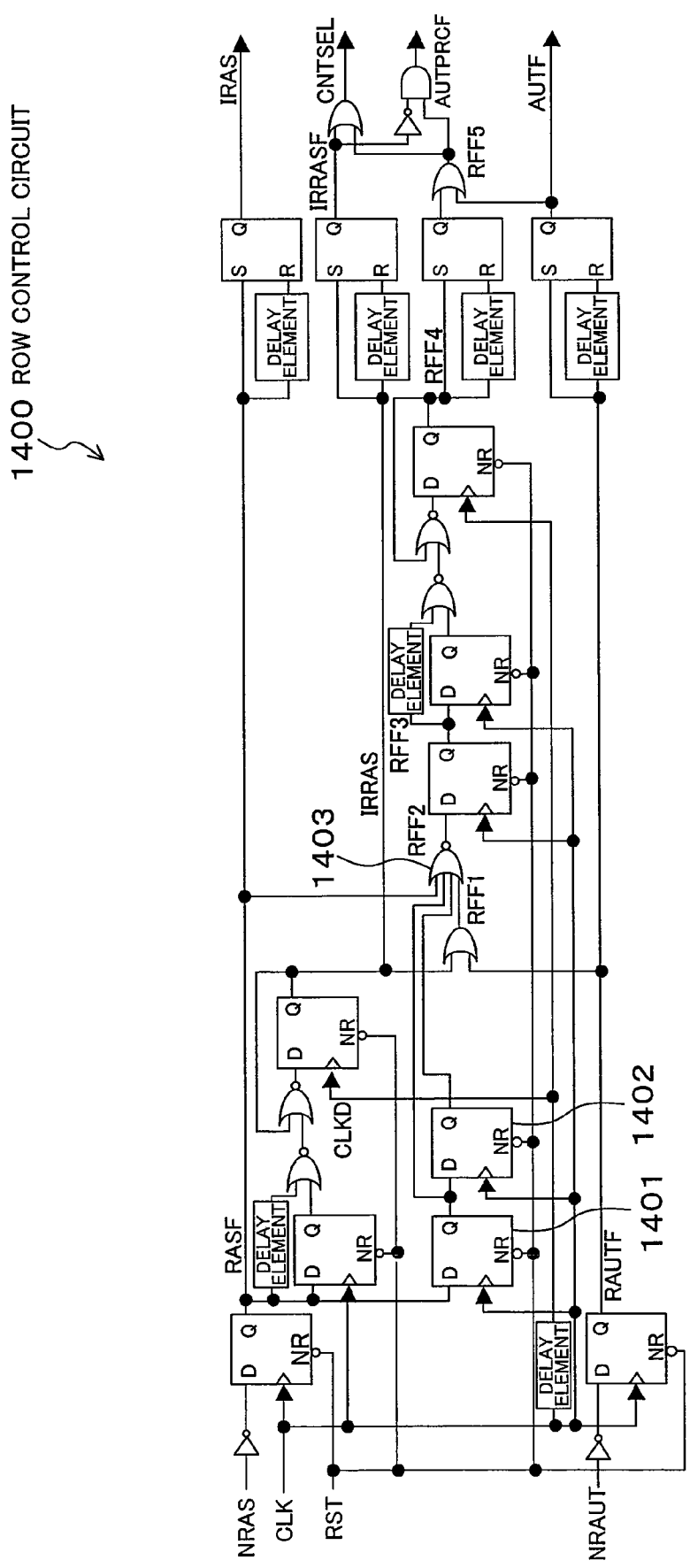
FIG. 13 is a structural diagram showing an overall structure of a row control circuit in a semiconductor memory device according to a second embodiment of the invention.

FIG. 13 is a structural diagram showing an overall structure of the row control circuit 1400 in the semiconductor memory device of the second embodiment.

In FIG. 13, 1401 and 1402 indicate an F/F with reset; and 1403 indicates a four-input OR element.

The row control circuit 1400 of this embodiment is different from the row control circuit 400 in the semiconductor memory device of the first embodiment in that respective outputs of the F/Fs with reset 1401 and 1402, a RAS flag RASF, and an internal flag RFF1 are applied to the four-input OR element 1403 and in that the four-input OR element 1403 outputs an internal flag RFF2.

Figure 14:
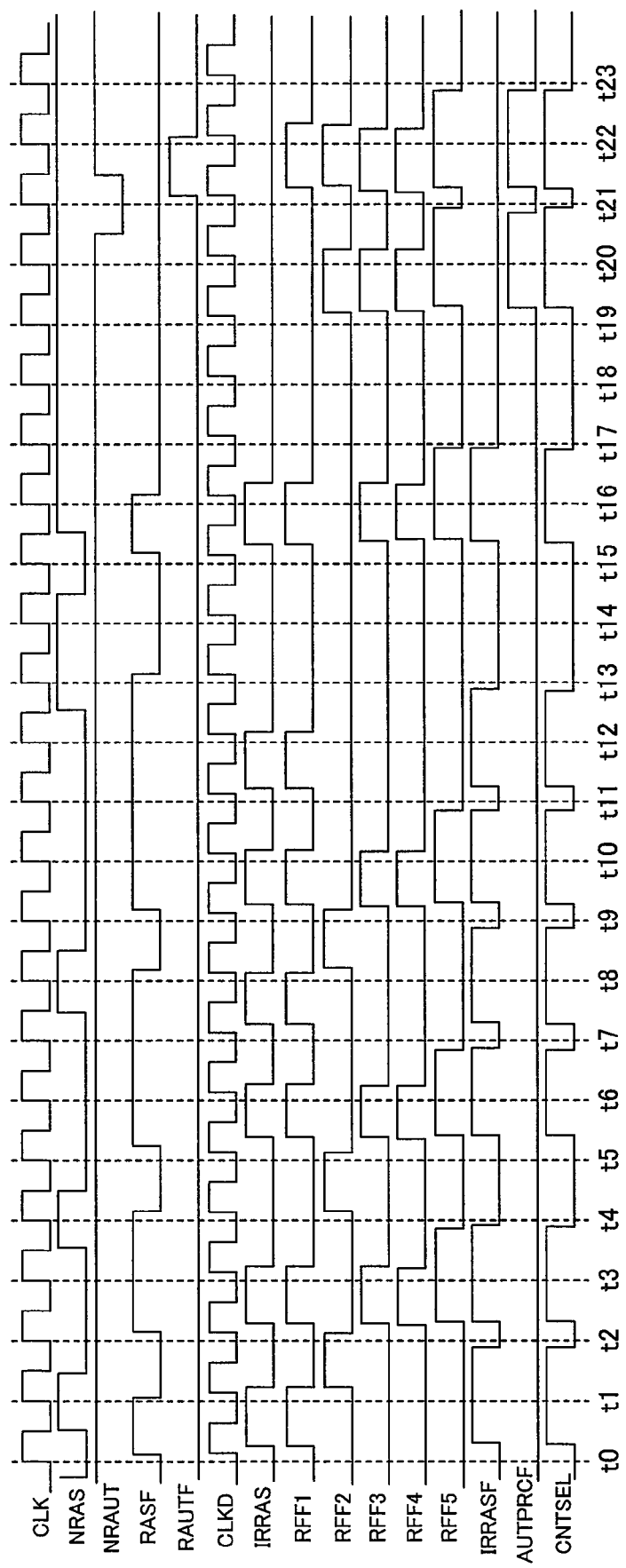
FIG. 14 is a timing diagram showing an operation timing of the semiconductor memory device of the second embodiment.

FIG. 14 is a diagram showing an operation timing in the semiconductor memory device of this embodiment.

In FIG. 14, t0-t2 is a random access; t2-t5 is an access with a page length of 2; t5-t9 is an access with a page length of 3; t9-t14 is an access with a page length of 4; t14-t15 is a precharge cycle; t15-t17 is a random cycle; t17-t21 is a precharge cycle; and t21-t22 is an auto refresh cycle.

As can be seen from the comparison between FIG. 14 and FIGS. 11 and 12, a function of stopping an internal refresh operation in a precharge period of two clock cycles including the immediately preceding CAS/precharge cycle is added, and an even number of precharge operations are prohibited only when the number of clock pulses in the precharge period is 4 or more.

As described above, in this embodiment, a system having the semiconductor memory device does not need to manage the number of clock pulses in the precharge period if the number of clock pulses in the precharge period is 3 or less. As a result, the system design can be facilitated. Note that the number of clock pulses in the precharge period which is to be managed by the system can be arbitrarily changed according to the design of the row control circuit.

Third Embodiment

Hereinafter, a semiconductor memory device according to a third embodiment of the invention will be described with reference to the figures.

The semiconductor memory device of this embodiment is different from that of the first embodiment in that the refresh counter 300 and the row control circuit 400 are replaced with a refresh counter 2300 and a row control circuit 2400. Since the structure is otherwise the same as the first embodiment, illustration and description thereof will be omitted.

Figure 15:
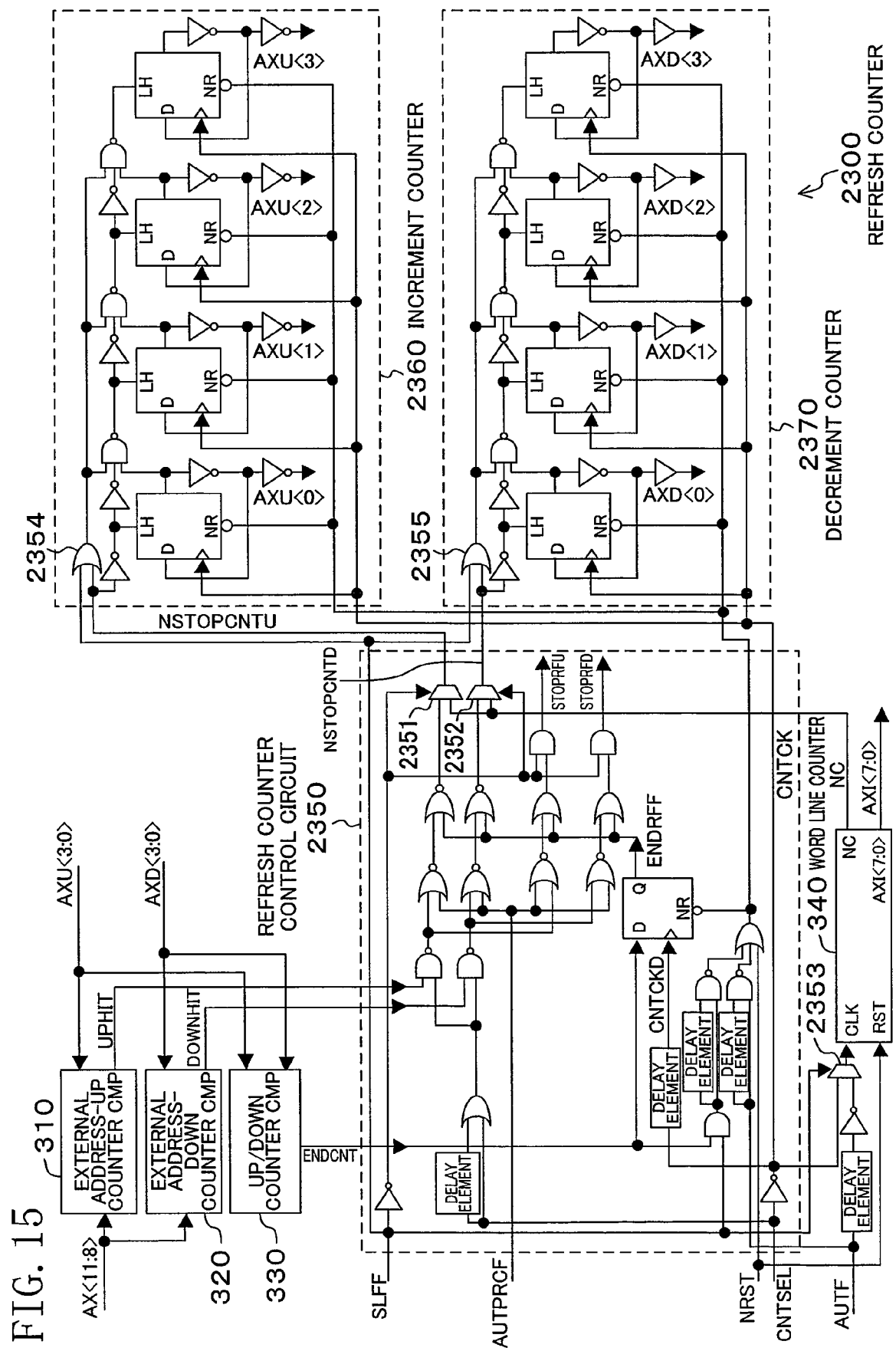
FIG. 15 is a structural diagram showing an overall structure of a refresh counter in a semiconductor memory device according to a third embodiment of the invention.

FIG. 15 is a structural diagram showing an overall structure of the refresh counter 2300 in the semiconductor memory device of the third embodiment.

In FIG. 15, 2351, 2352, and 2353 indicate a selector; 2354 and 2355 indicate an OR element; SLFF indicates a self refresh flag; and NC indicates a carry output (a negative logic) of a word line counter.

The refresh counter 2300 of this embodiment is different from the refresh counter 300 in the semiconductor memory device of the first embodiment in that the refresh counter control circuit 350 is replaced with a refresh counter control circuit 2350 and that the increment counter 360 and the decrement counter 370 are replaced with an increment counter 2360 and a decrement counter 2370.

Figure 16:
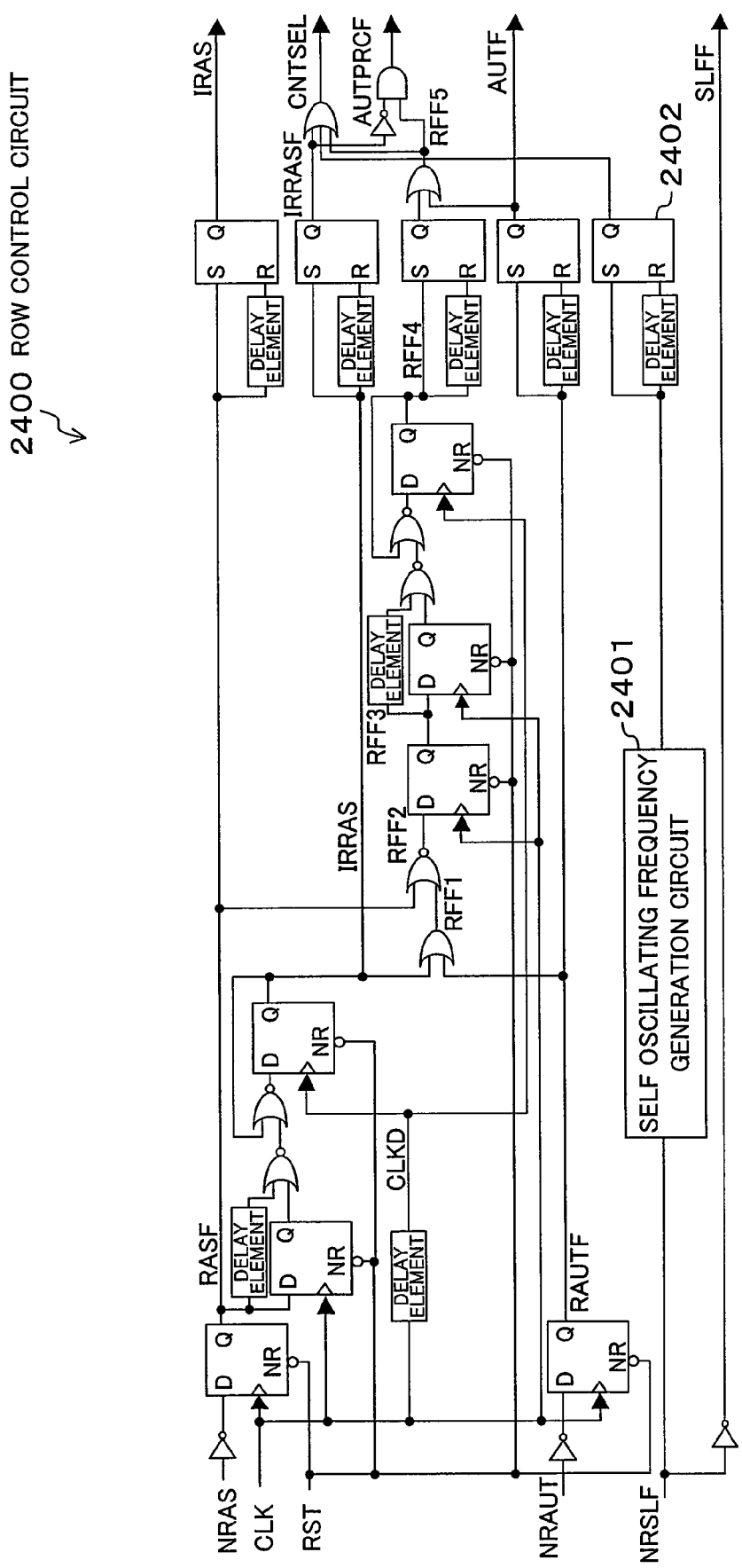
FIG. 16 is a structural diagram showing an overall structure of a row control circuit in the semiconductor memory device of the third embodiment.

FIG. 16 is a structural diagram showing an overall structure of the row control circuit 2400 in the semiconductor memory device of this embodiment.

The row control circuit 2400 of this embodiment is different from the row control circuit 400 in the semiconductor memory device of the first embodiment in that the row control circuit 2400 includes an additional circuit. More specifically, in response to an external self refresh command NRSLF, a self refresh flag SLFF is generated, a self refresh oscillating frequency is generated in a self oscillating frequency generation circuit 2401, and a counter select signal CNTSEL is generated by using an R-S (Reset-Set) F/F 2402.

In this embodiment, in a self refresh mode, a self refresh flag SLFF is enabled and a counter clock CNTCK that operates in a self oscillation period in a self refresh operation is selected as a clock for the word line counter 340. At the same time, an inverted logic value of the carry output NC of the word line counter 340 is applied to a load hold port of a counter in a first stage in each of the increment counter 2360 and the decrement counter 2370. Refresh stop signals STO-PRFU and STOPRFD are forcibly disabled.

Accordingly, the word line counter 340 and the increment counter 2360 and the decrement counter 2370 operate as two serially connected duodecimal counters in the self oscillation period, and two blocks are simultaneously activated and refreshed. In other words, in a normal operation, the word line counter 340 is counted up and the increment counter 2360 and the decrement counter 2370 are reset in response to an external auto refresh command that is periodically applied from the outside. In the structure of this embodiment, however, all the word line addresses can be automatically refreshed even in a self refresh operation in which the external auto refresh command is not applied.

Since the same counter reset circuit as that used in a normal simultaneous refresh operation can be used to reset the increment counter 2360 and the decrement counter 2370, area overhead can be minimized.

Fourth Embodiment

Hereinafter, a semiconductor memory device according to a fourth embodiment of the invention will be described with reference to the figures.

The semiconductor memory device of this embodiment is different from that of the first embodiment in that the refresh counter 300 is replaced with a refresh counter 3300. Since the structure is otherwise the same as that of the first embodiment, illustration and description thereof will be omitted.

Figure 17:
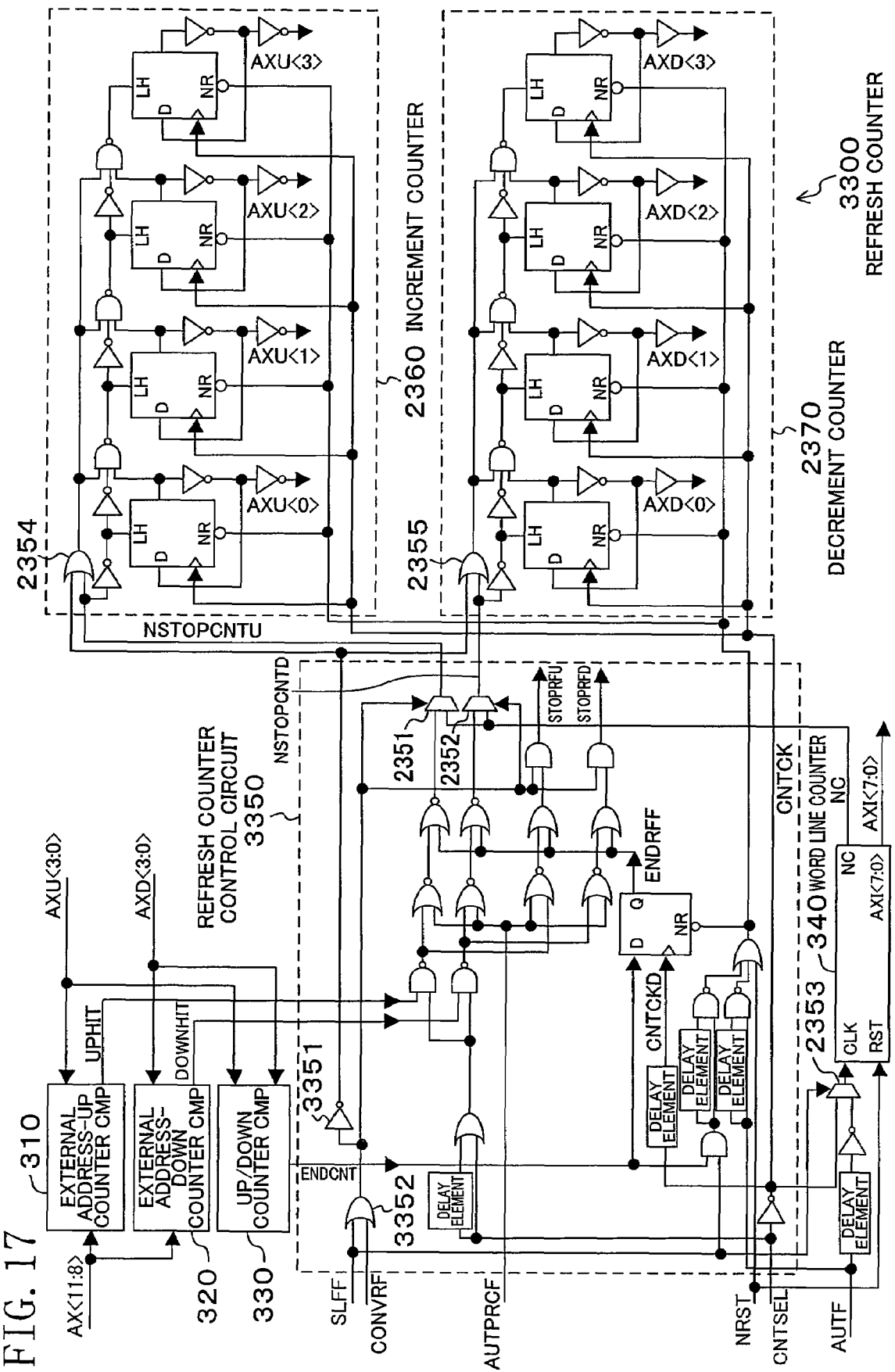
FIG. 17 is a structural diagram showing an overall structure of a refresh counter in a semiconductor memory device according to a fourth embodiment of the invention.

FIG. 17 is a structural diagram showing an overall structure of the refresh counter 3300 in the semiconductor memory device of the fourth embodiment.

The refresh counter 3300 of this embodiment is different from the refresh counter 2300 in the semiconductor memory device of the third embodiment in that the refresh counter 3300 additionally includes an inverter element 3351 and a NOR element 3352. A counter control switch signal CONVRF is input to the refresh counter 3300.

In this embodiment, an internal refresh counter operation is switched from a simultaneous refresh operation to the same counter control as that in the conventional self refresh mode by controlling the counter control switch signal CONVRF in the test mode or by the system.

Fifth Embodiment

Hereinafter, a semiconductor memory device according to a fifth embodiment of the invention will be described with reference to the figures.

The semiconductor memory device of this embodiment is different from that of the first embodiment in that the refresh counter 300 is replaced with a refresh counter 4300. Since the structure is otherwise the same as the first embodiment, illustration and description thereof will be omitted.

Figure 18:
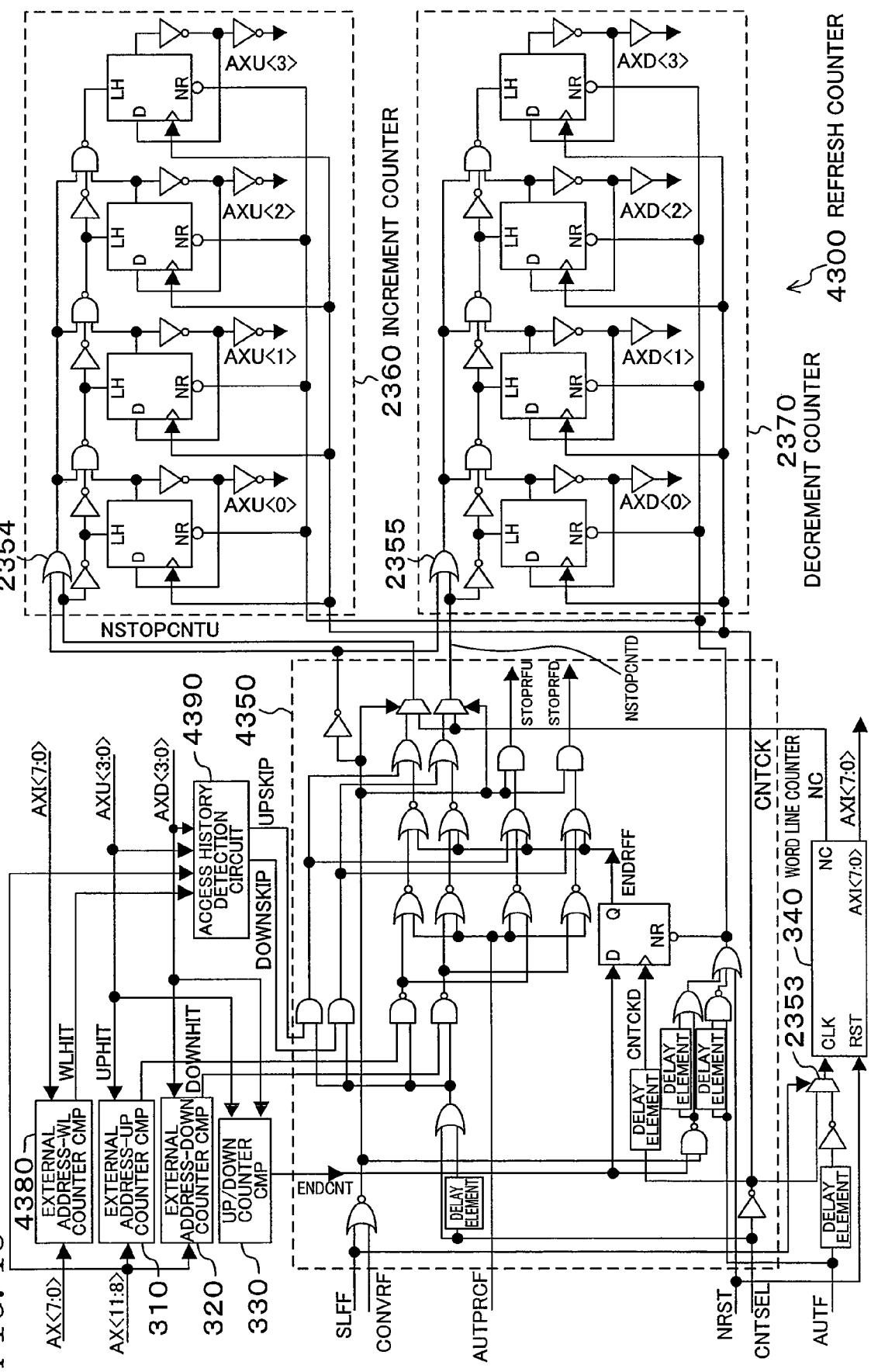
FIG. 18 is a structural diagram showing an overall structure of a refresh counter in a semiconductor memory device according to a fifth embodiment of the invention.

FIG. 18 is a structural diagram showing an overall structure of the refresh counter 4300 in the semiconductor memory device according to the fifth embodiment of the invention.

In FIG. 18, 4350 indicates a refresh counter control circuit; 4380 indicates an external address-WL counter comparator (CMP) for comparing an external address AX<7:0> with a word line counter address AXI<7:0>; 4390 indicates an access history detection circuit; WLHIT indicates a match flag of the comparator 4380; UPSKIP indicates a first refresh skip signal; and DOWNSKIP indicates a second refresh skip signal.

Figure 19:
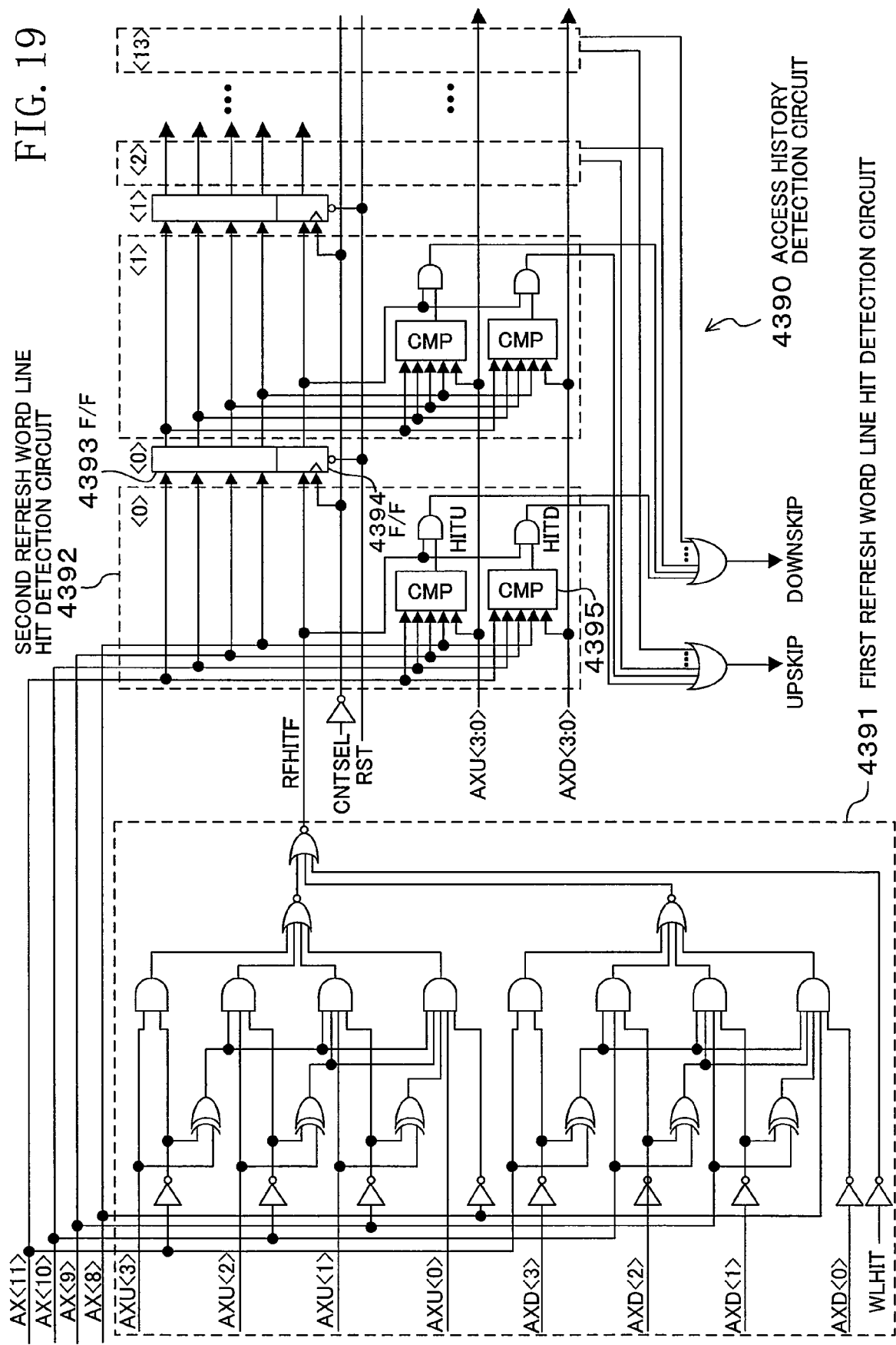
FIG. 19 is a structural diagram showing an overall structure of an access history detection circuit in FIG. 18.

FIG. 19 is a structural diagram showing an overall structure of the access history detection circuit 4390 in the refresh counter 4300 of this embodiment.

In FIG. 19, 4391 indicates a first refresh word line hit detection circuit; 4392 indicates a second refresh word line hit detection circuit; 4393 indicates a 4-bit F/F; 4394 indicates a 1-bit F/F; 4395 indicates a comparator (CMP); and RFHITF indicates a hit flag of a refresh word line hit detection circuit.

Figure 20:
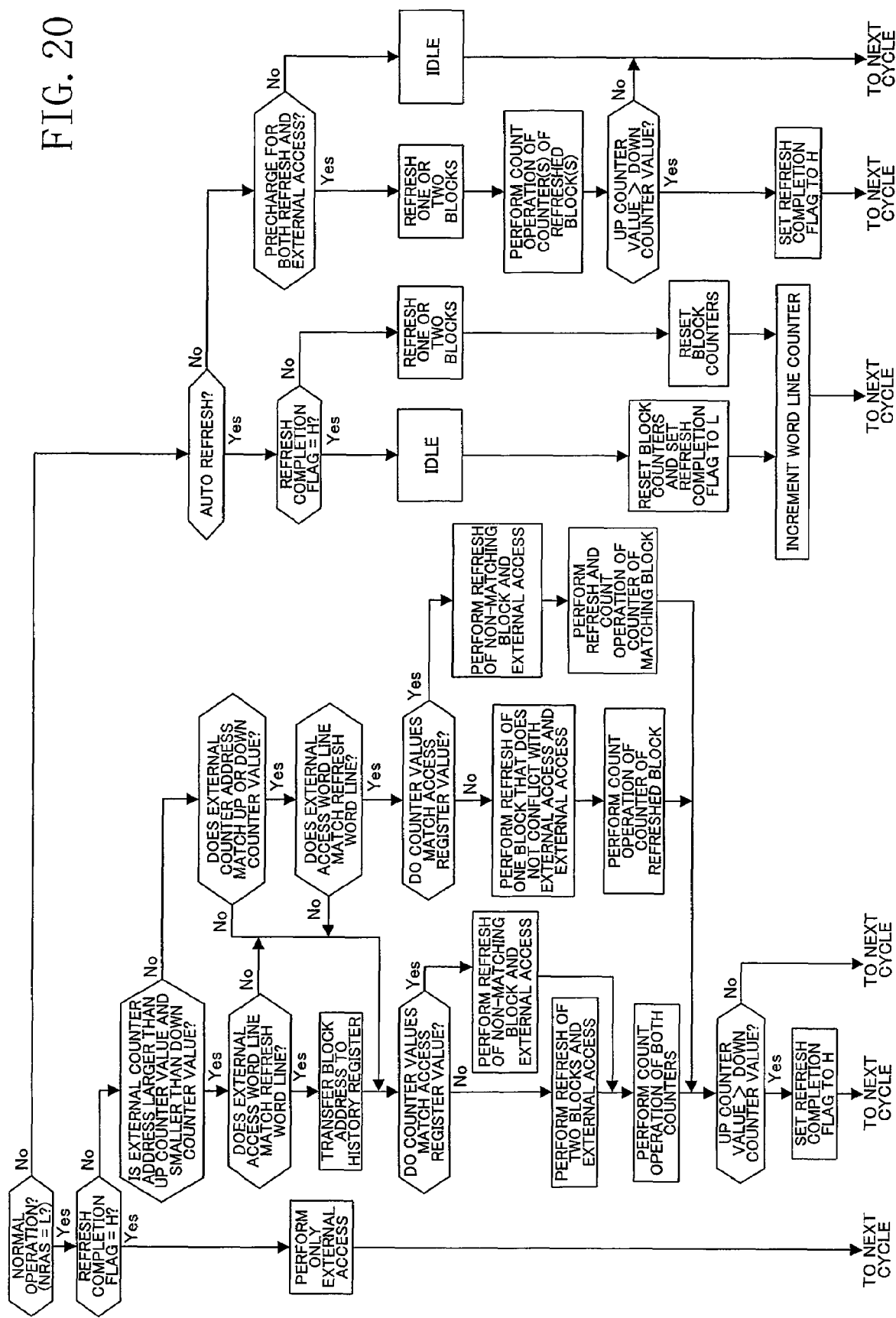
FIG. 20 is a flow chart illustrating an operation flow in the semiconductor memory device of the fifth embodiment.

FIG. 20 is a flow chart showing an operation flow in the semiconductor memory device of this embodiment.

In this embodiment, the refresh word line hit flag RFHITF is enabled only when both of the following conditions are satisfied: an external access word line address AX<7:0> matches a refresh word line address AXI<7:0>; and an external access block address AX<11:8> is smaller than an increment refresh block counter address AXU<3:0> and larger than a decrement counter address AXD<3:0>.

The fact that the refresh word line hit flag RFHITF has been enabled means that a word line that is to be internally refreshed in the next auto refresh cycle in the current cycle or subsequent cycles has been externally accessed.

After the refresh word line hit flag RFHITF is enabled, the first or second refresh skip signal UPSKIP, DOWNSKIP is enabled when the external access block address in the current cycle matches either the internal increment counter address AXU<3:0> or the decrement counter address AXD<3:0>. After the first or second refresh skip signal UPSKIP, DOWNSKIP is enabled, either an increment refresh block counter address refresh stop signal STOPPFU or a decrement refresh block counter address refresh stop signal STOPRFD is enabled, and refresh of the corresponding block is stopped. At the same time, an increment counter stop flag NSOPCNTU or a decrement counter stop flag NSTOPCNTD of this block is forcibly disabled. Therefore, a count operation of the corresponding refresh counter is performed, and refresh of this block is skipped as a result.

While an auto refresh command is externally applied, an external access block address and a hit flag RFHITF are respectively stored in the 4-bit F/F 4393 and the 1-bit F/F 4394 sequentially in each cycle, and all the stored addresses and an address of an access block of the current refresh cycle are simultaneously referred to and compared to determine if the refresh is to be skipped or not.

As has been described above, in the case where a word line that is to be refreshed is externally accessed first, it is equivalent that this word line has been refreshed, and refresh is skipped. Therefore, increase in power consumption due to unnecessary refresh can be suppressed.

Sixth Embodiment

Hereinafter, a semiconductor memory device according to a sixth embodiment of the invention will be described with reference to the figures.

The semiconductor memory device of this embodiment is different from that of the first embodiment in that the refresh block selector 260 and the refresh counter 300 are replaced with a refresh block selector 5260 and a refresh counter 5300. Since the structure is otherwise the same as that in the first embodiment, illustration and description thereof will be omitted.

Figure 21:
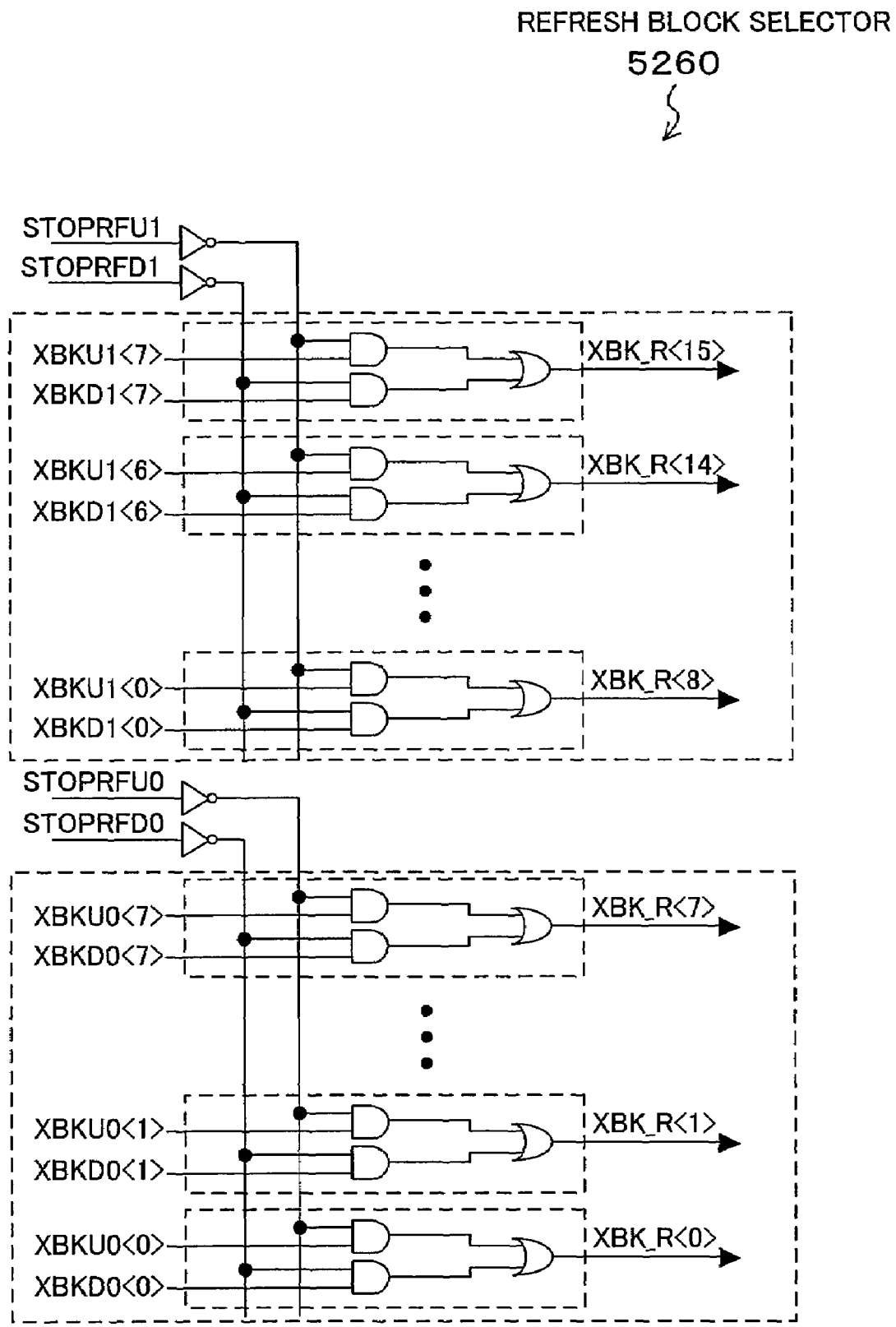
FIG. 21 is a structural diagram showing an overall structure of a refresh block selector in a semiconductor memory device according to a sixth embodiment of the invention.

FIG. 21 is a structural diagram showing an overall structure of the refresh block selector 5260 in the semiconductor memory device of the sixth embodiment.

The refresh block selector 5260 of this embodiment is different from the refresh block selector 260 in the semiconductor memory device of the first embodiment in that a refresh block selection signal XBK_R<15:0> is generated by two different refresh block counters. More specifically, a logic sum of a refresh block predecode signal XBKU0<15:0> of a first increment block counter and a refresh block predecode signal XBKD0<15:0> of a first decrement block counter is generated as a refresh block selection signal XBK_R<7:0>.

The refresh block predecode signal XBKU0<15:0> of the first increment block counter is generated by predecoding a first increment refresh block counter address AXU0<11:8>. The refresh block predecode signal XBKD0<15:0> of the first decrement block counter is generated by predecoding a first decrement refresh block counter address AXD0<11:8>.

Similarly, a logic sum of a refresh block predecode signal XBKU1<15:0> of a second increment block counter and a refresh block predecode signal XBKD1<15:0> of a second decrement block counter is generated as a refresh block selection signal XBK_R<15:8>. The refresh block predecode signal XBKU1<15:0> of the second increment block counter is generated by predecoding a second increment refresh block counter address AXU1<11:8>. The refresh block predecode signal XBKD1<15:0> of the second decrement block counter is generated by predecoding a second decrement refresh block counter address AXD1<11:8>. Whether the refresh block selection signals XBK_R<7:0> and XBK_R<15:8> are enabled or not is controlled by first and second increment refresh block counter address stop signals STOPRFU0 and STOPRFU1 and the first and second decrement refresh block counter address stop signals STOPRFD0 and STOPRFD1.

Figure 22:
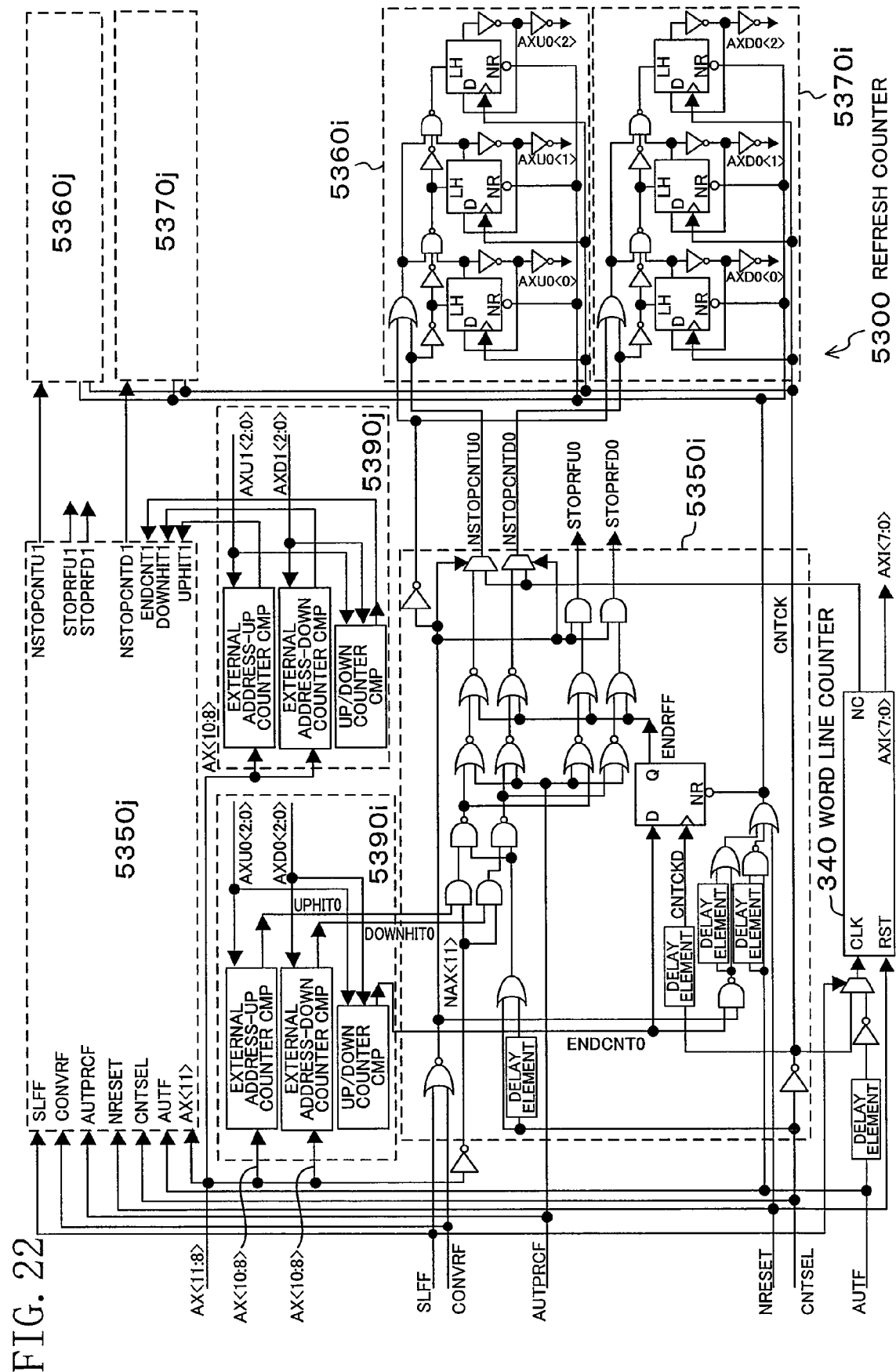
FIG. 22 is a structural diagram showing an overall structure of a refresh counter in the semiconductor memory device of the sixth embodiment.

FIG. 22 is a structural diagram showing an overall structure of the refresh counter 5300 in the semiconductor memory device of this embodiment.

The refresh counter 5300 of this embodiment is different from the refresh counter 3300 in the semiconductor memory device of the fourth embodiment in that the refresh counter 5300 is formed by two independently controlled pairs of an increment block counter and a decrement block counter. In other words, a first ternary increment counter 5360$i$ and a first ternary decrement counter 5370$i$ are controlled by a first refresh counter control circuit 5350$i$ and a first address comparison block 5390$i$. Similarly, a second ternary increment counter 5360$j$ and a second ternary decrement counter 5370$j$ are controlled by a second refresh counter control circuit 5350$j$ and a second address comparison block 5390$j$.

In FIG. 22, ENDRFF0 and ENDRFF1 indicate first and second refresh completion flags; NSTOPCNTU0 and NSTOPCNTU1 indicate first and second increment counter stop flags; and NSTOPCNTD0 and NSTOPCNTD1 indicate first and second decrement counter stop flags.

In this embodiment, at most four blocks can be simultaneously internally refreshed while arbitrating so that an external access block and an internal refresh memory block does not conflict by the same control method as that in the first through fifth embodiments. For example, it is herein assumed that a DRAM having a charge retention time of 1 ms and 4096 word lines (4096 WL=256 WL×16 blocks) is to be refreshed. In this case, in the first through fifth embodiments, an external auto refresh command needs to be applied every 3906 ns and 15 cycles of random operation are required within the refresh period (within the charge retention time). Therefore, a random cycle has to be at least 260 ns. In this embodiment, however, only 7 cycles of random operation, at worst, need be performed within the same refresh period. Therefore, the semiconductor memory device operates normally even when a random cycle is as low as 558 ns. Even when the number of memory blocks is doubled (32 memory blocks), the semiconductor memory device operates normally at a random cycle of as low as 260 ns.

Seventh Embodiment

Hereinafter, a semiconductor memory device according to a seventh embodiment of the invention will be described with reference to the figures.

The semiconductor memory device of this embodiment is different from that of the first embodiment in that the refresh word line predecoder 250, the refresh block selector 260, and the refresh counter 300 are replaced with a refresh word line predecoder 6250, a refresh block selector 6260, and a refresh counter 6300. Since the structure is otherwise the same as the first embodiment, illustration and description thereof will be omitted.

Figure 23:
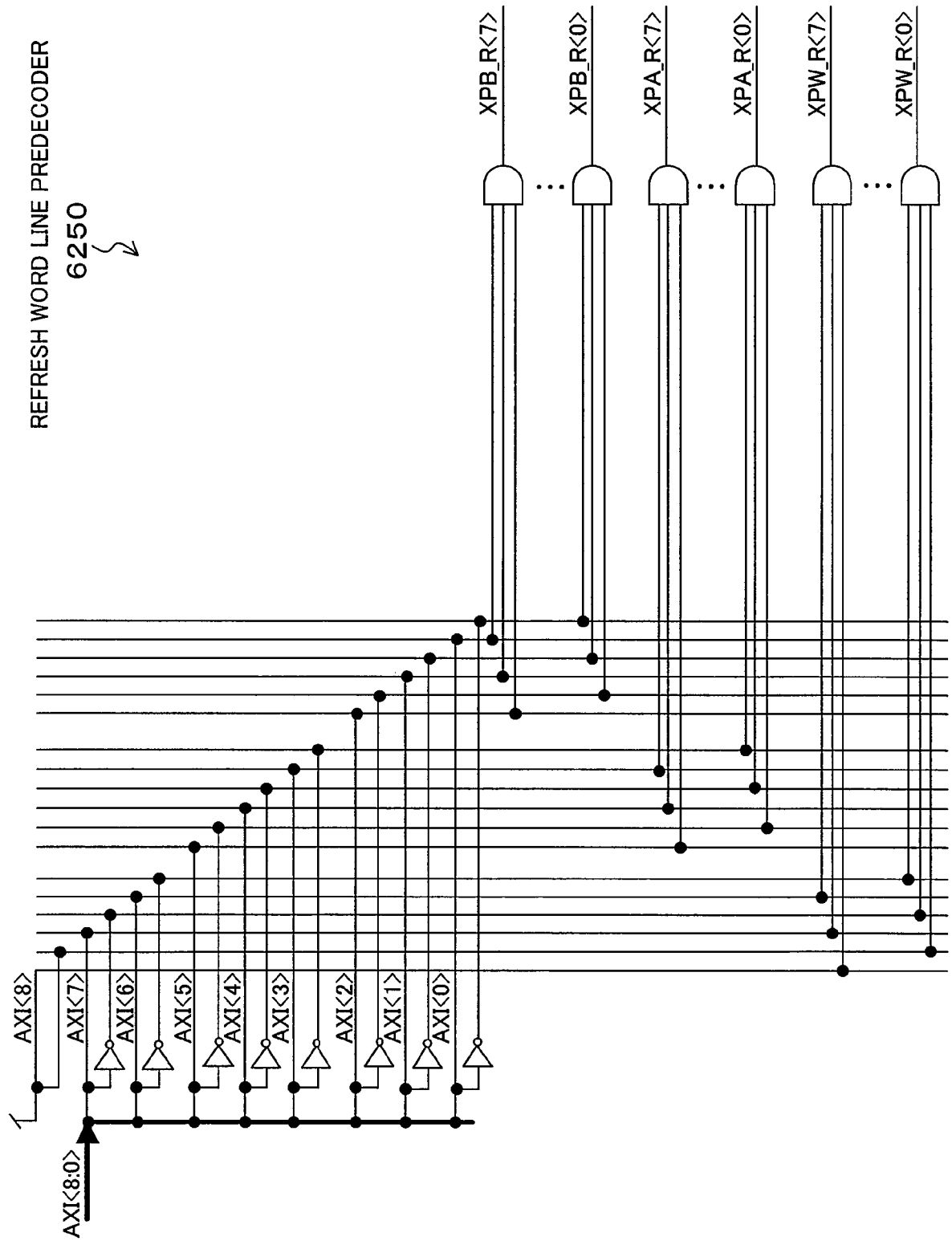
FIG. 23 is a structural diagram showing an overall structure of a refresh word line predecoder in a semiconductor memory device according to a seventh embodiment of the invention.

FIG. 23 is a structural diagram showing an overall structure of the refresh word line predecoder 6250 in the semiconductor memory device of the seventh embodiment.

The refresh word line predecoder 6250 of this embodiment selects two predecode signals XPW<7:0> regardless of an address of the refresh counter 6300.

Figure 24:
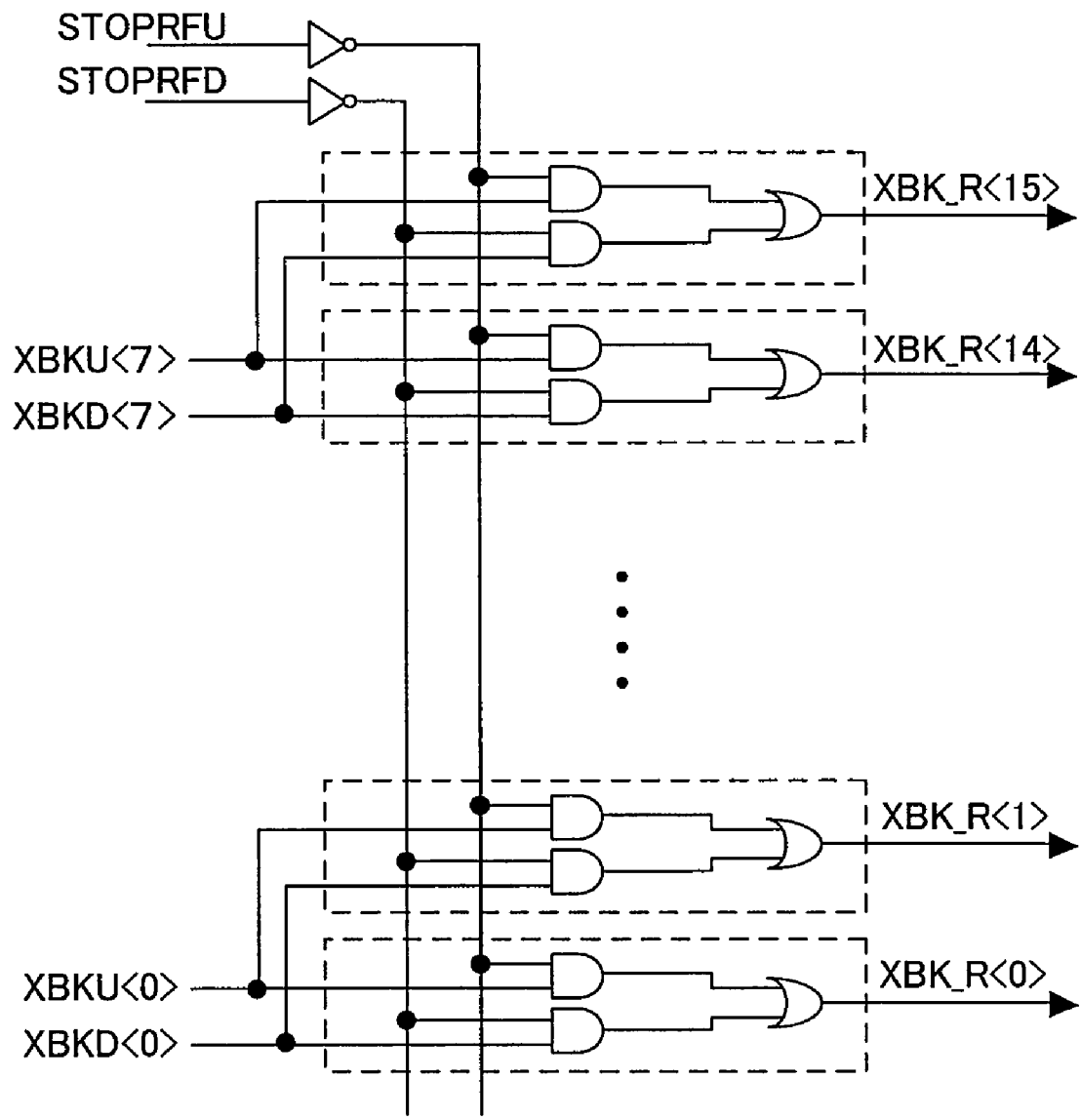
FIG. 24 is a structural diagram showing an overall structure of a refresh block selector in the semiconductor memory device of the seventh embodiment.

FIG. 24 is a structural diagram showing an overall structure of the refresh block selector 6260 in the semiconductor memory device of this embodiment.

The refresh block selector 6260 of this embodiment is different from the refresh block selector 260 of the first embodiment in that a common refresh block predecode signal XBKU<15:0> of an increment block counter and a common refresh block predecode signal XBKD<15:0> of a decrement block counter are applied to every two refresh block selection signals XBK_R<15:0>. At most two refresh block selection signals XBK_R<15:0> are thus selected at the same time.

Figure 25:
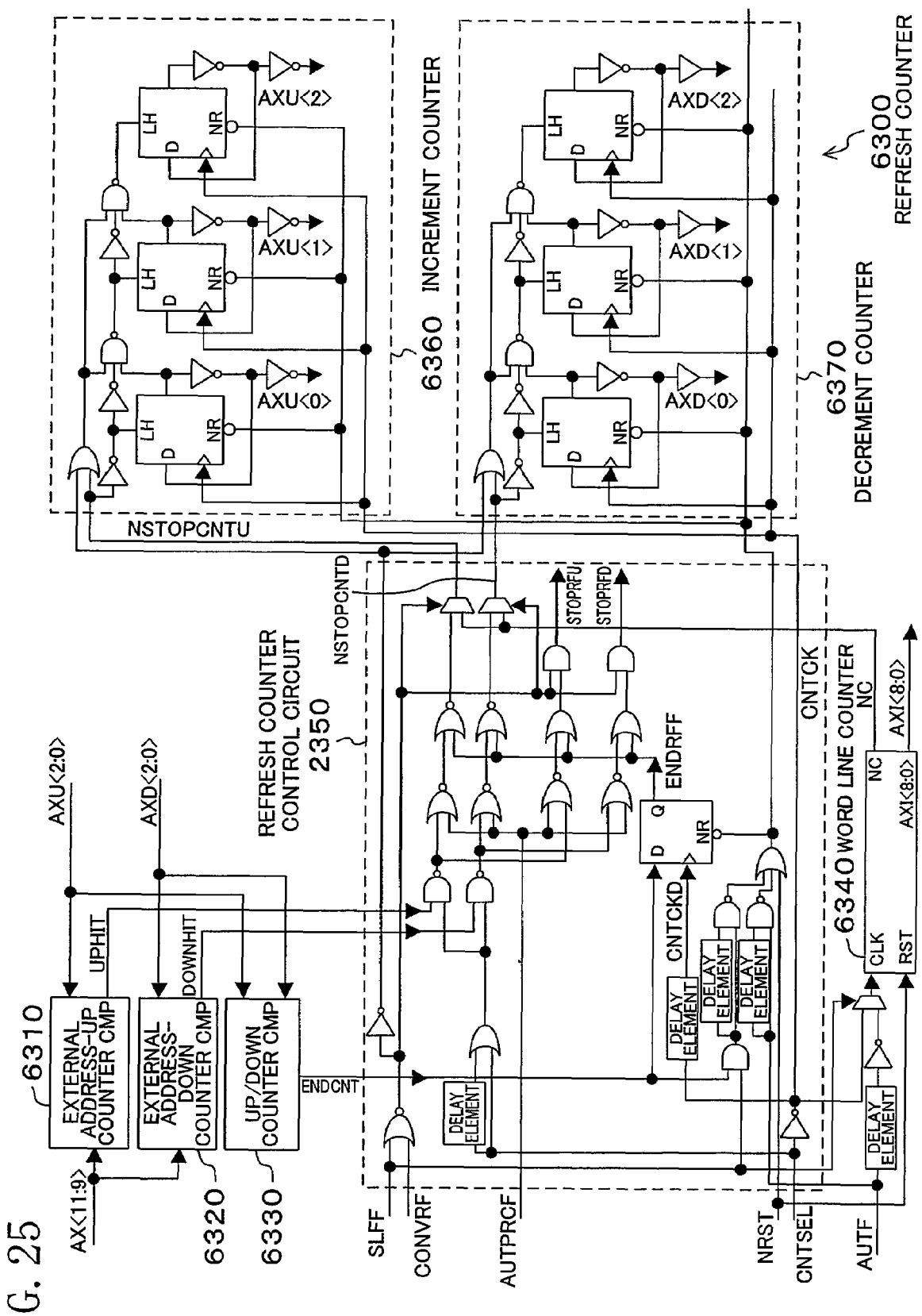
FIG. 25 is a structural diagram showing an overall structure of a refresh counter in the semiconductor memory device of the seventh embodiment.
Figure 26:
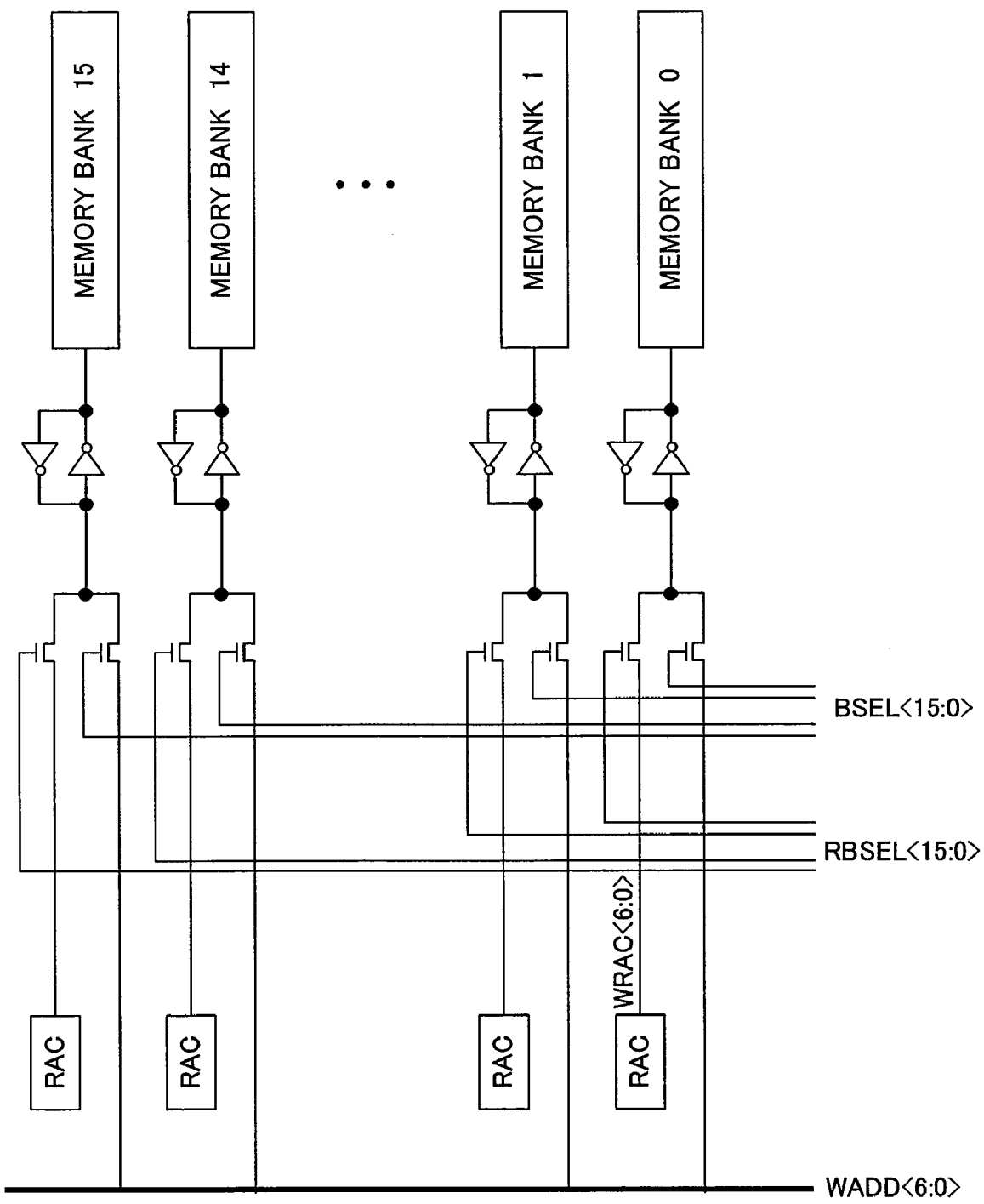
FIG. 26 is a block diagram showing an overall structure of a conventional semiconductor memory device.

FIG. 25 is a structural diagram showing an overall structure of the refresh counter 6300 in the semiconductor memory device of this embodiment.

The refresh counter 6300 of this embodiment is different from the refresh counter 3300 in the semiconductor memory device of the fourth embodiment in that the increment block counter 2360 and the decrement block counter 2370 are replaced with a ternary increment block counter 6360 and a ternary decrement block counter 6370.

In this embodiment, as in the sixth embodiment, at most four blocks can be simultaneously internally refreshed while arbitrating so that an external access and an internal refresh memory block does not conflict. Moreover, this can be implemented by the circuitry with a smaller area than the circuitry of the sixth embodiment.

It should be understood that the invention is not limited to the above embodiments and various modifications can be made within the scope of the invention.

As has been described above, external access and internal refresh can be conducted at the same time with a reduced area and reduced power consumption without requiring the system having the semiconductor memory device to consider internal refresh addresses. Therefore, the invention is especially useful as a semiconductor memory device with a short charge retention time, a control method thereof, and the like.

What is claimed is:
1. A semiconductor memory device, comprising:
a plurality of memory blocks each including a plurality of memory cells arranged in a matrix pattern, a plurality of word lines respectively corresponding to rows of the plurality of memory cells, a plurality of bit lines respectively corresponding to columns of the plurality of memory cells, and a plurality of sense amplifiers respectively corresponding to the columns of the plurality of memory cells, wherein one of the plurality of word lines is activated simultaneously, the semiconductor memory device further comprising:
a plurality of refresh block counters for generating block addresses of at least two memory blocks to select at least two memory blocks to be refreshed from the plurality of memory blocks;

a refresh word line counter for generating a common word line address that is common to the at least two memory blocks; and an arbitration circuit for generating at least one first word line address based on the at least two block addresses and the common word line address and arbitrating so that each word line indicated by the at least one first word line address is refreshed during a period in which a word line indicated by an externally applied second word line address is accessed.

2. The semiconductor memory device according to claim 1, wherein the arbitration circuit arbitrates so that, when one of the at least two memory blocks selected by the plurality of refresh block counters matches a memory block that corresponds to the second word line address and that is externally accessed, refresh of the one of the at least two memory blocks is stopped.

3. The semiconductor memory device according to claim 1, wherein a count operation of the plurality of refresh block counters is performed every time refresh is performed, and the refresh word line counter is counted up after refresh of all the memory blocks is completed.

4. The semiconductor memory device according to claim 1, wherein an external refresh request is applied to the semiconductor memory device in every predetermined period, and the predetermined period is a period in which a number of unrefreshed memory blocks in the semiconductor memory device becomes at most one.

5. The semiconductor memory device according to claim 4, wherein when the external refresh request is applied to the semiconductor memory device, a block address of an unrefreshed memory block is stored as a common address in each of the plurality of refresh block counters.

6. The semiconductor memory device according to claim 1, wherein every time the external refresh request is applied to the semiconductor memory device, the plurality of refresh block counters are reset and the refresh word line counter is counted up.

7. The semiconductor memory device according to claim 6, wherein a dummy external refresh request is applied to the semiconductor memory device right before a normal operation is started after a power supply is turned on or the semiconductor memory device is restored from self refresh.

8. The semiconductor memory device according to claim 1, wherein a count operation of the plurality of refresh block counters is performed every time refresh is performed, and after refresh of all the memory blocks is completed, the arbitration circuit arbitrates so that an internal refresh operation is stopped until the refresh word line counter is counted up next.

9. The semiconductor memory device according to claim 1, wherein the plurality of refresh block counters are a pair of an increment counter and a decrement counter.

10. The semiconductor memory device according to claim 9, wherein when a value of the increment counter exceeds a value of the decrement counter, the arbitration circuit generates a flag indicating that refresh of all the memory blocks is completed.

11. The semiconductor memory device according to claim 9, wherein when an external refresh request is applied to the semiconductor memory device and a value of the increment counter matches a value of the decrement counter, the arbitration circuit arbitrates so that a memory block indicated by the increment counter and the decrement counter is refreshed in an external refresh access cycle.

12. The semiconductor memory device according to claim 1, wherein in a self refresh operation, the plurality of refresh block counters are switched so that a count operation of the plurality of refresh block counters is performed according to a carry output signal of the refresh word line counter.

13. The semiconductor memory device according to claim 12, wherein a count operation of the plurality of refresh block counters and the refresh word line counter is performed in a self refresh period.

14. The semiconductor memory device according to claim 1, wherein by external control of the semiconductor memory device, the plurality of refresh block counters are switched so that a count operation of the plurality of refresh block counters is performed according to a carry output signal of the refresh word line counter.

15. The semiconductor memory device according to claim 1, further comprising a storage section for storing the second word line address externally supplied to the semiconductor memory device, wherein the arbitration circuit compares the at least one first word line address with at least one second word line address stored in the storage section, and when the first word line address matches the at least one second word line address, the arbitration circuit arbitrates so that refresh of a word line indicated by the at least one first word line address is skipped.

16. The semiconductor memory device according to claim 15, wherein the storage section includes a storage section for storing an external access memory block address and a storage section for storing a match flag of the first and second word line addresses.

17. The semiconductor memory device according to claim 15, wherein the storage section is reset every time an external refresh request is applied to the semiconductor memory device.

18. The semiconductor memory device according to claim 1, wherein the at least one first word line address is transmitted through a first predecode signal line and the second word line address is transmitted through a second predecode signal line, and a number of first predecode signal lines is equal to a number of second predecode signal lines.

19. The semiconductor memory device according to claim 1, wherein the plurality of refresh block counters are a plurality of pairs of an increment counter and a decrement counter, and one of the plurality of pairs of an increment counter and a decrement counter is assigned to each of a plurality of regions in a plurality of memory arrays formed by the plurality of memory cells.

20. The semiconductor memory device according to claim 1, wherein the arbitration circuit arbitrates so that each word line indicated by the at least one first word line address is refreshed during a page access period in which the semiconductor memory device is externally accessed.

21. The semiconductor memory device according to claim 1, wherein when a precharge period is detected, the arbitration circuit arbitrates so that word lines indicated by a plurality of first word line addresses are simultaneously refreshed.

22. A semiconductor memory device, comprising:
a plurality of memory blocks each including a plurality of memory cells arranged in a matrix pattern, a plurality of word lines respectively corresponding to rows of the plurality of memory cells, a plurality of bit lines respectively corresponding to columns of the plurality of memory cells, and a plurality of sense amplifiers respectively corresponding to the columns of the plurality of memory cells, wherein one of the plurality of word lines is activated simultaneously, the semiconductor memory device further comprising:
a plurality of refresh block counters for generating a block address that is common to the plurality of memory blocks;

a refresh word line counter for generating a common word line address that is common to at least two of the plurality of memory blocks; and an arbitration circuit for generating at least one first word line address based on the block address and the common word line address and arbitrating so that each word line indicated by the at least one first word line address is refreshed during a period in which a word line indicated by an externally applied second word line address is accessed.

23. The semiconductor memory device according to claim 22, wherein the arbitration circuit arbitrates so that each word line indicated by the at least one first word line address is refreshed during a page access period in which the semiconductor memory device is externally accessed.

24. The semiconductor memory device according to claim 23, further comprising a row control circuit, wherein the row control circuit counts a number of clock pulses during an enabled period of a row access command signal that is externally applied over a plurality of cycles, and generates an internal simultaneous refresh command every predetermined number of pulses.

25. The semiconductor memory device according to claim 24, wherein the row control circuit counts a number of clock pulses during a disabled period of a row access command signal that is externally applied, and generates an internal simultaneous refresh command every predetermined number of pulses.

26. The semiconductor memory device according to claim 23, wherein a number of input clock pulses that are applied to the semiconductor memory device during a precharge period of the semiconductor memory device is at most a predetermined limit value.

27. The semiconductor memory device according to claim 26, wherein when a minimum random cycle is two clock cycles, the number of input clock pulses that are applied to the semiconductor memory device during the precharge period is an odd number.

28. The semiconductor memory device according to claim 26, wherein when a minimum random cycle is two clock cycles and the number of input clock pulses that are applied to the semiconductor memory device during the precharge period is at least a predetermined value, the number of input clock pulses during the precharge period is an odd number.

29. The semiconductor memory device according to claim 22, wherein when a precharge period is detected, the arbitration circuit arbitrates so that word lines indicated by a plurality of first word line addresses are simultaneously refreshed.

* * * * *